(12) United States Patent
Matsunaga et al.

(10) Patent No.: US 7,505,312 B2
(45) Date of Patent: Mar. 17, 2009

(54) NONVOLATILE SEMICONDUCTOR MEMORY DEVICE CAPABLE OF CONTROLLING PROXIMITY EFFECT DUE TO COUPLING BETWEEN ADJACENT CHARGE STORAGE LAYERS

(75) Inventors: Yasuhiko Matsunaga, Yokohama (JP); Fumitaka Arai, Yokohama (JP); Atsuhiro Sato, Yokohama (JP); Makoto Sakuma, Kuwana (JP); Masato Endo, Ashigarakami-gun (JP); Kiyohito Nishihara, Yokohama (JP); Keiji Shuto, Yokohama (JP); Naohisa Iino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 11/447,963

(22) Filed: Jun. 7, 2006

(65) Prior Publication Data
US 2007/0177431 A1 Aug. 2, 2007

(30) Foreign Application Priority Data
Jan. 31, 2006 (JP) .............................. 2006-023875

(51) Int. Cl.
*G11C 16/10* (2006.01)
(52) U.S. Cl. ........................... 365/185.02; 365/185.03; 365/185.22; 365/185.17; 365/185.12; 365/185.11; 365/185.24
(58) Field of Classification Search ............ 365/185.22, 365/185.02, 185.03, 185.17, 185.12, 185.24, 365/185.11
See application file for complete search history.

(56) References Cited

U.S. PATENT DOCUMENTS

| 6,643,188 B2 | 11/2003 | Tanaka et al. |
| 6,781,877 B2 * | 8/2004 | Cernea et al. .......... 365/185.03 |
| 7,027,329 B2 | 4/2006 | Sakuma et al. |

FOREIGN PATENT DOCUMENTS

| JP | 2002-324400 | | 11/2002 |
| JP | 2003-109386 | | 4/2003 |
| JP | 2003-196988 | | 7/2003 |
| JP | 2004-192789 | | 7/2004 |
| JP | 2005-25898 | | 1/2005 |
| JP | 2005-243205 | | 9/2005 |
| JP | 2005-538485 | | 12/2005 |
| JP | 2007-207333 | * | 8/2007 |
| KR | 10-2005-0004142 | | 1/2005 |

\* cited by examiner

*Primary Examiner*—Andrew Q Tran
(74) *Attorney, Agent, or Firm*—Oblon, Spivak, McClelland, Maier & Neustadt, P.C.

(57) ABSTRACT

There is disclosed a semiconductor integrated circuit device including a memory cell array having a plurality of blocks, a first non-volatile semiconductor memory cell which is arranged in the memory cell array and has an electric charge storage layer, and a second non-volatile semiconductor memory cell which is arranged in the memory cell array to be adjacent to the first non-volatile semiconductor memory cell and has an electric charge storage layer. Regular data writing is performed with respect to the second non-volatile semiconductor memory cell after regular data writing is carried out with respect to the first non-volatile semiconductor memory cell. Additional data writing is performed with respect to the first non-volatile semiconductor memory cell after regular data writing is carried out with respect to the second non-volatile semiconductor memory cell.

9 Claims, 29 Drawing Sheets

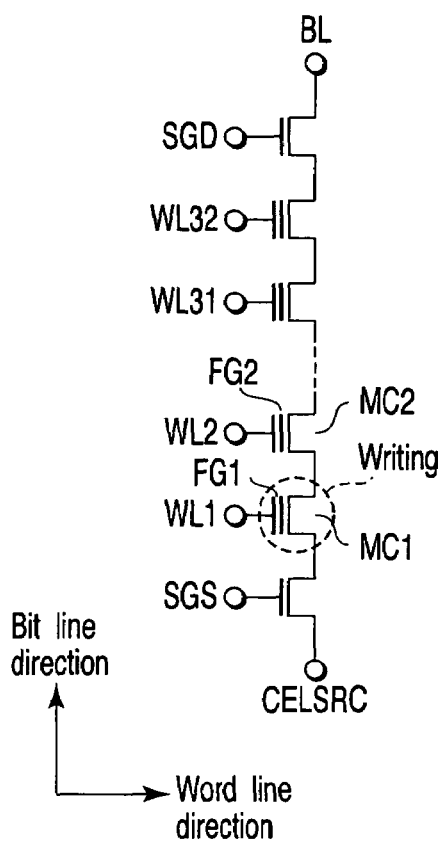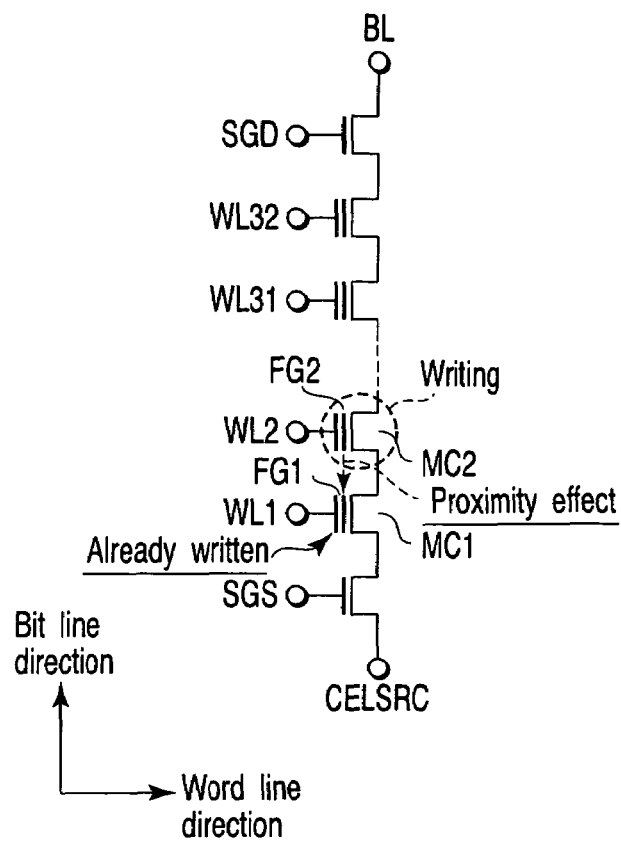
FIG. 1A　　　FIG. 1B
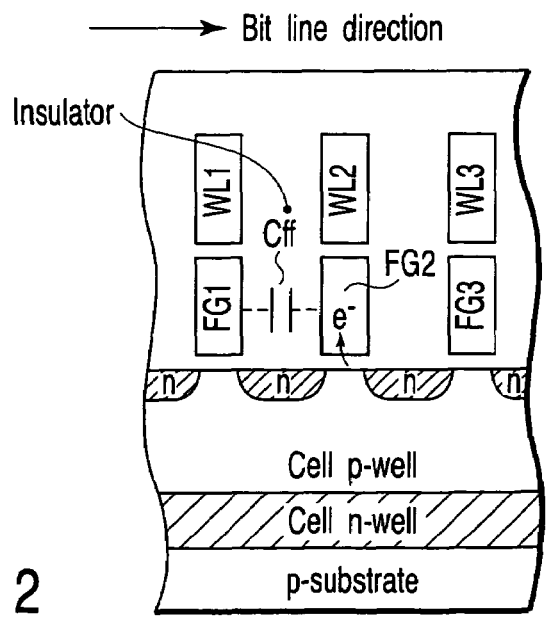
FIG. 2

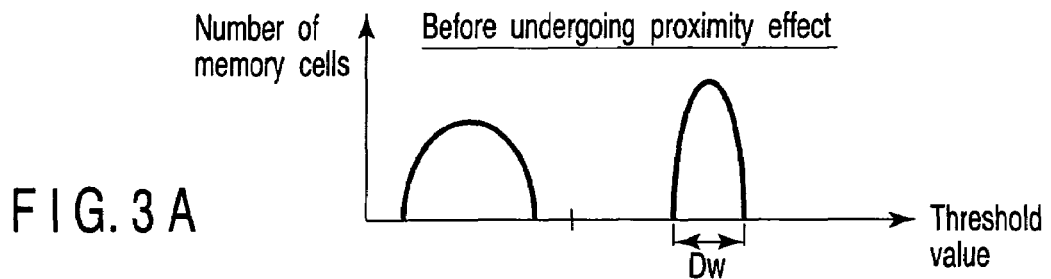
FIG. 3A
FIG. 3B
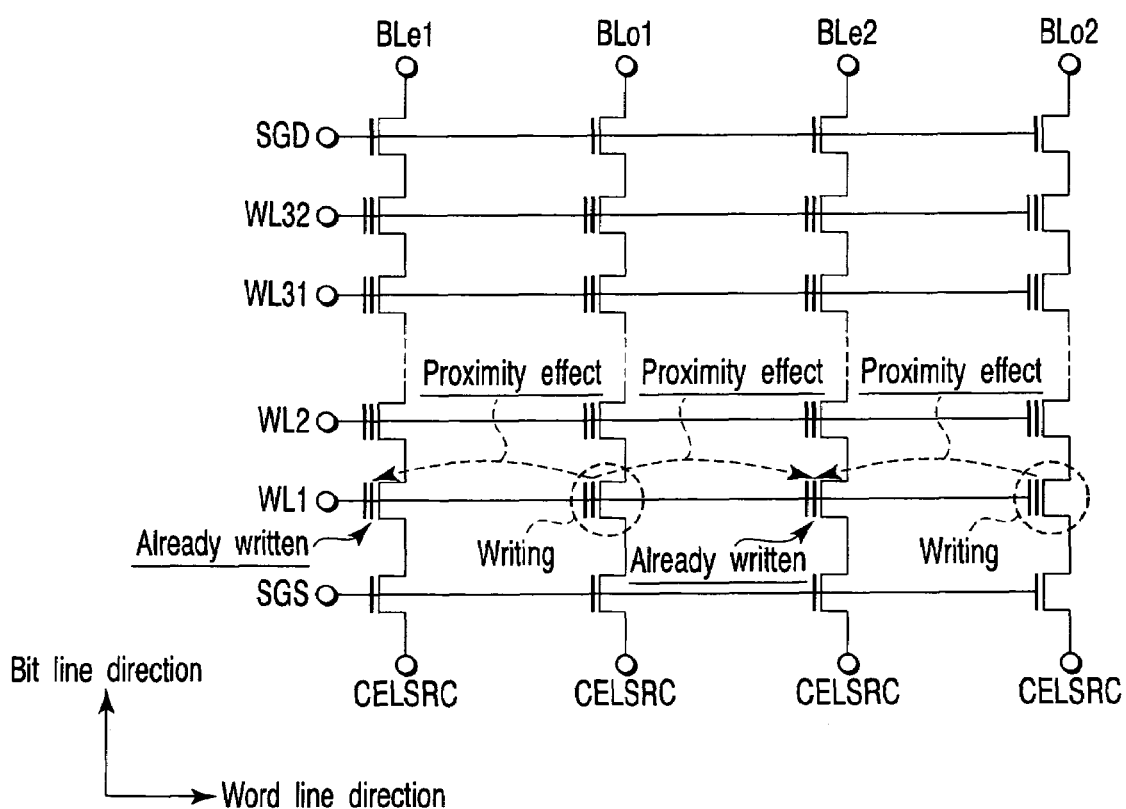
FIG. 4

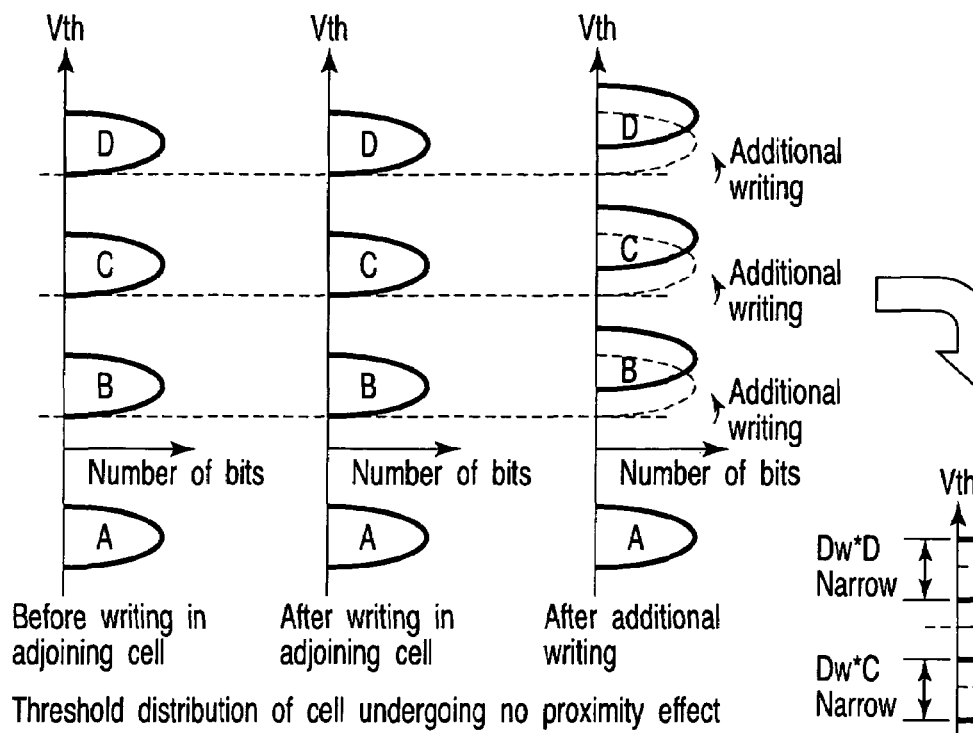
FIG. 18A Threshold distribution of cell undergoing no proximity effect
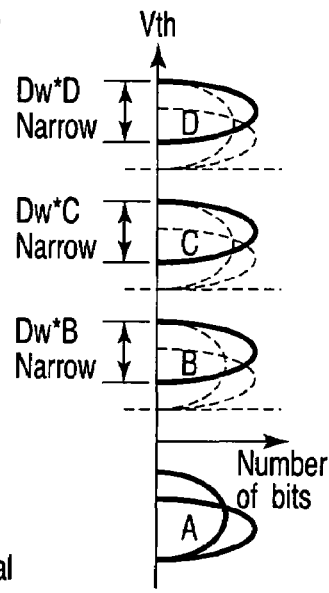
FIG. 18C
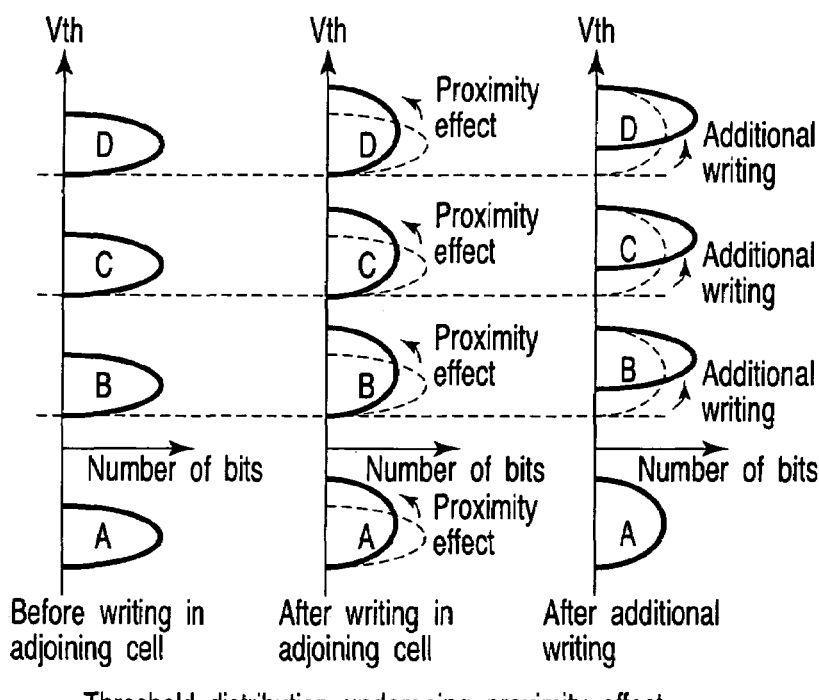
FIG. 18B Threshold distribution undergoing proximity effect

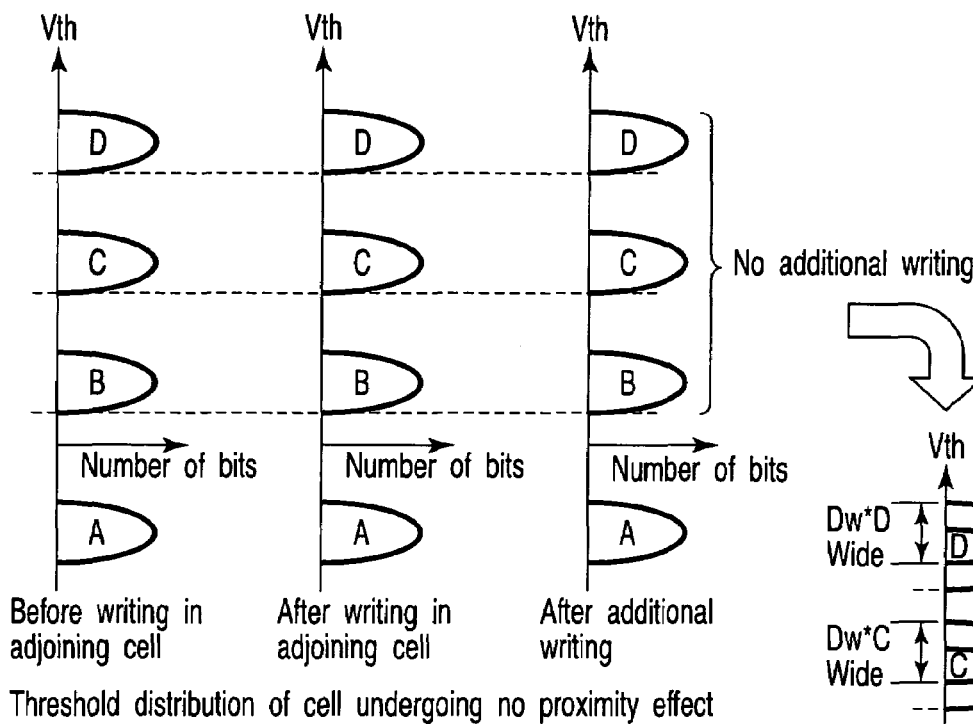
FIG. 19A REFRENCE EXAMPLE
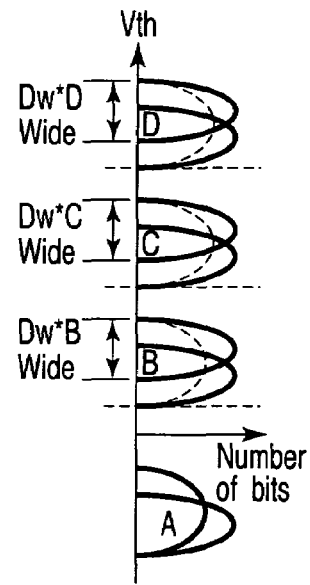
FIG. 19C REFRENCE EXAMPLE
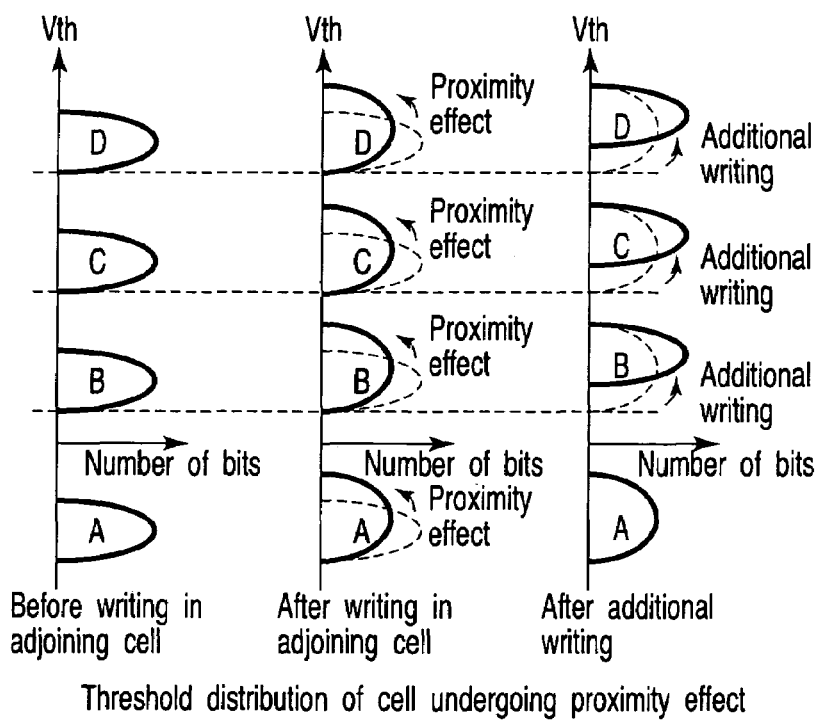
FIG. 19B REFRENCE EXAMPLE

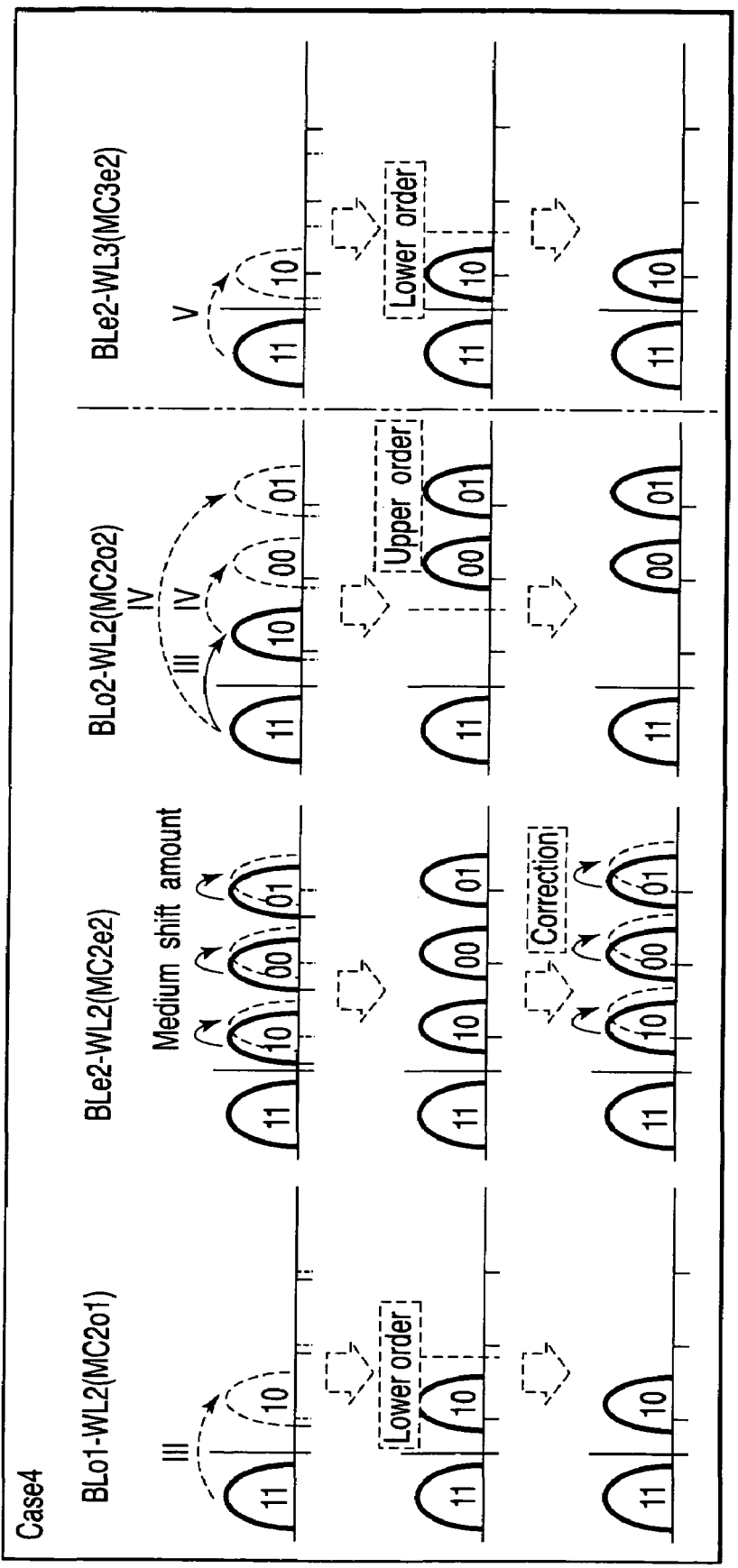
F I G. 36

NONVOLATILE SEMICONDUCTOR MEMORY DEVICE CAPABLE OF CONTROLLING PROXIMITY EFFECT DUE TO COUPLING BETWEEN ADJACENT CHARGE STORAGE LAYERS

CROSS-REFERENCE TO RELATED APPLICATIONS

This application is based upon and claims the benefit of priority from prior Japanese Patent Application No. 2006-023875, filed Jan. 31, 2006, the entire contents of which are incorporated herein by reference.

BACKGROUND OF THE INVENTION

1. Field of the Invention

The present invention relates to a semiconductor integrated circuit device, and more particularly to a semiconductor integrated circuit device including a non-volatile semiconductor memory in which data are rewritable.

2. Description of the Related Art

A non-volatile semiconductor memory in which data are rewritable, e.g., a NAND type flash memory has a tendency that its storage capacity is further increasing.

With the advancement of miniaturization of a memory cell with an increase in storage capacity, there has emerged a phenomenon which has conventionally rarely appeared, e.g., a phenomenon such as a fluctuation in threshold value due to potentials of floating gates of cells adjacent to each other. This fluctuation in threshold value is called the proximity effect.

The proximity effect fluctuates a threshold value of a memory cell in which data has been already written. This becomes a problem when narrowing a threshold distribution width.

The present invention provides a semiconductor integrated circuit device having a non-volatile semiconductor memory which can realize a narrow threshold distribution width.

BRIEF SUMMARY OF THE INVENTION

A semiconductor integrated circuit device according to a first aspect of the present invention comprises: a memory cell array having a plurality of blocks;

a first non-volatile semiconductor memory cell which is arranged in the memory cell array and has an electric charge storage layer; and a second non-volatile semiconductor memory cell which is arranged in the memory cell array to be adjacent to the first non-volatile semiconductor memory cell and has an electric charge storage layer, regular data writing being performed with respect to the second non-volatile semiconductor memory cell after regular data writing is carried out with respect to the first non-volatile semiconductor memory, additional data writing being executed with respect to the first non-volatile semiconductor memory cell after regular data writing is carried out with respect to the second non-volatile semiconductor memory cell.

A semiconductor integrated circuit device according to a second aspect of the present invention comprises: a memory cell array having a plurality of block each including a plurality of pages;

a first non-volatile semiconductor memory cell which has an electric charge storage layer and is arranged in the memory cell array;

a second non-volatile semiconductor memory cell which has an electric charge storage layer and is arranged in the memory cell array to be adjacent to the first non-volatile semiconductor memory cell;

a third non-volatile semiconductor memory cell which has an electric charge storage layer and is arranged in the memory cell array to be adjacent to the first non-volatile semiconductor memory cell;

a fourth non-volatile semiconductor memory cell which has an electric charge storage layer and is arranged in the memory cell array to be adjacent to the second non-volatile semiconductor memory cell;

a first bit line extending along a bit line direction;

a second bit line extending along the bit line direction;

a first word line extending along a word line direction crossing the bit line direction, the electric charge storage layer of the first non-volatile semiconductor memory cell being capacity-coupled with the first word line, one end of a current path of the first non-volatile semiconductor memory cell being connected with one end of a current path of the third non-volatile semiconductor memory cell, the electric charge storage layer of the second non-volatile semiconductor memory cell being capacity-coupled with the first word line, one end of a current path of the second non-volatile semiconductor memory cell being connected with one end of a current path of the fourth non-volatile semiconductor memory cell; and a second word line extending along the word line direction, the electric charge storage layer of the third non-volatile semiconductor memory cell being capacity-coupled with the second word line, the other end of the current path of the third non-volatile semiconductor memory cell being electrically connected with the first bit line, the electric charge storage layer of the fourth non-volatile semiconductor memory cell being capacity-coupled with the second word line, the other end of the current path of the fourth non-volatile semiconductor memory cell being electrically connected with the second bit line, wherein regular data writing is performed with respect to the second non-volatile semiconductor memory cell after regular data writing is carried out with respect to the first non-volatile semiconductor memory cell, regular data writing is performed with respect to the third non-volatile semiconductor memory cell after regular data writing is carried out with respect to the second non-volatile semiconductor memory cell, and additional data writing is performed with respect to the first non-volatile semiconductor memory cell after regular data writing is carried out with respect to the third non-volatile semiconductor memory cell.

BRIEF DESCRIPTION OF THE SEVERAL VIEWS OF THE DRAWING

FIGS. 1A and 1B are views showing writing data in a memory cell;

FIG. 2 is a cross-sectional view taken along a bit line direction of memory cells;

FIG. 3A is a view showing a threshold distribution before undergoing the proximity effect, and FIG. 3B is a view showing a threshold distribution after undergoing the proximity effect;

FIG. 4 is a view showing writing data with respect to memory cells;

FIGS. 18A to 18C are views showing threshold distributions obtained by using an operation method according to a second embodiment of the present invention;

FIGS. 19A to 19C are views showing threshold distributions obtained by using an operation method according to a reference example of the second embodiment of the present invention;

FIG. 36 is a view showing changes in threshold distributions according to the third example of the writing method of the third embodiment (Case 4);

DETAILED DESCRIPTION OF THE INVENTION

Figure 5:
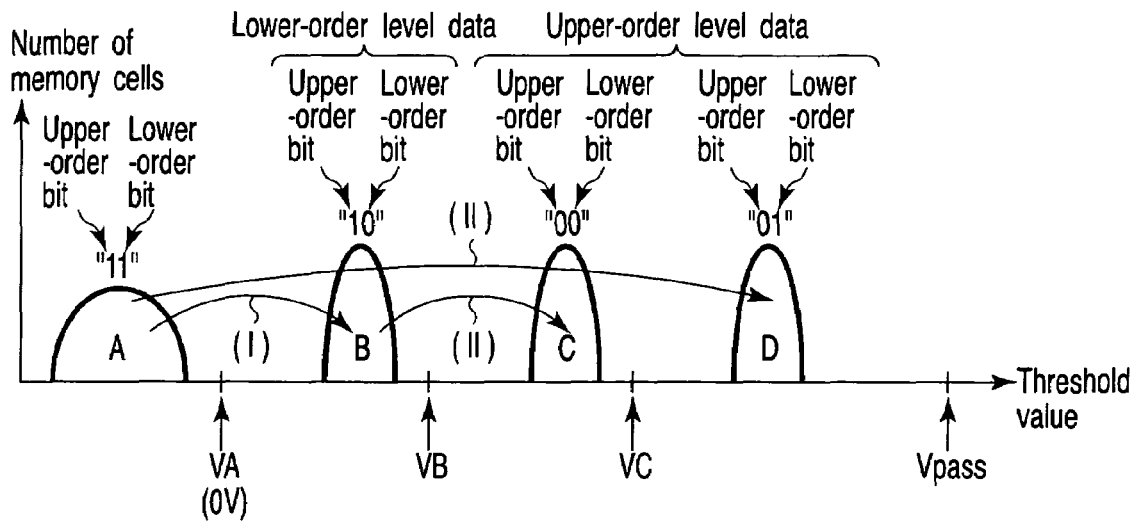
FIG. 5 is a view showing threshold distributions of memory cells.

Prior to an explanation of embodiments, the proximity effect will be briefly described.

In a non-volatile semiconductor memory, e.g., a NAND type flash memory, data is written page by page. That is, when a write operation for one page is finished, the write operation advances to the next page. It is general that pages are set in units of a word line. For example, when data is written in a memory cell MC1 connected with a word line WL1 (see FIG. 1A), data is then written in a memory cell MC2 connected with a word line WL2 (see FIG. 1B).

Here, it is assumed that data "0" is written in the memory cell MC2. When data "0" is written, an electron e− is injected into a charge storage layer, e.g., a floating gate FG2 of the memory cell MC2, and a potential of the floating gate FG2 is thereby reduced. The floating gate FG2 is adjacent to a floating gate FG1 of the memory cell MC1 through an insulator along a bit line direction (see FIG. 2). The floating gate FG2 is coupled with the floating gate FG1 of the memory cell MC1 through a parasitic capacitance Cff. When the potential of the floating gate FG2 is reduced, the floating gate FG1 is subjected to capacity coupling with the floating gate FG2, whereby the potential of the floating gate FG1 is lowered. Data has been already written in the memory cell MC1. The fact that the potential of the floating gate FG1 of the memory cell MC1 in which data has been already written is reduced means that a threshold value Vth of the memory cell MC1 in which data has been already written has changed. This is the proximity effect. FIG. 3A shows a threshold distribution Dw of a memory cell before undergoing the proximity effect, and FIG. 3B shows a threshold distribution Dw' after undergoing the proximity effect.

As shown in FIGS. 3A and 3B, the proximity effect increases the threshold distribution width Dw of the memory cell having data written therein to the distribution width Dw'. This makes it difficult to control the threshold distribution within a target range.

The proximity effect occurs not only between memory cells adjacent to each other in a bit line direction but also between memory cells adjacent to each other in a word line. For example, it is a NAND type flash memory adopting a mode in which data is alternately written through an even-numbered bit line BLe and an odd-numbered bit line BLo (see FIG. 4). In the NAND type flash memory adopting this mode, the proximity effect occurs between memory cells adjacent to each other in a word line direction.

With the miniaturization of memory cells, so called multi-valuing which stores three or more levels in one memory cell is making progress. A threshold distribution width of a multivalued NAND type flash memory is smaller than that in a two-valued NAND type flash memory. Therefore, control over a threshold value in the multivalued NAND type flash memory is delicate as compared with that in the two-valued NAND type flash memory.

Although the two-valued NAND type flash memory is also affected by the proximity effect, the multivalued NAND type flash memory is more prominently affected by the proximity effect. For example, in a four-valued NAND type flash memory, three or more threshold distributions must be formed between an intermediate voltage Vpass and 0 V. Therefore, a threshold distribution width must be narrowed.

Embodiments according to the present invention will now be described hereinafter with reference to the accompanying drawings. It is to be noted that like reference numerals denote like parts throughout the drawings.

FIRST EMBODIMENT

In this embodiment, a non-volatile semiconductor memory, e.g., a NAND type flash memory is taken as an example of a semiconductor integrated circuit device. This example shows a multivalued NAND type flash memory in which information of three or more levels is stored in one memory cell, but embodiments according to the present invention are not restricted to the multivalued NAND type flash memory. An example of multilevel is four levels. FIG. 5 shows an example of threshold distributions of a four-valued NAND type flash memory.

As shown in FIG. 5, as threshold distributions according to one example, there are four distributions of A, B, C and D in the order from a low threshold value to a high threshold value. The four distributions are separated with three read voltages VA, VB and VC as boundaries. The distribution A having a lowest threshold value is in an erasing state and placed at a position lower than the read voltage VA. An example of the read voltage VA is 0 V. In this example, the distribution A takes a negative value. The distribution A corresponds to, e.g., data "11". The distribution B is in a writing state and placed at a position higher than the read voltage VA and lower than the read voltage VB. The distribution B corresponds to, e.g., data "10". The distribution C is also in the writing state and placed at a position higher than the read voltage VB and lower than the read voltage VC. The distribution C corresponds to, e.g., data "00". The distribution D is also in the writing state and placed at a position higher than the read voltage VC and lower than an intermediate voltage Vpass. The distribution D corresponds to, e.g., data "01". The intermediate voltage Vpass is a voltage higher than the read voltage VC and lower than a write voltage Vpgm.

In this example, data is written in the order from a lower-order bit to a upper-order bit.

First, if a lower-order bit of write data is "0", an electron is injected into a floating gate of a memory cell, and a threshold value is thereby shifted from the distribution A (the erasing state) to the distribution B. On the contrary, the lower-order bit is "1", an electron is suppressed from being injected into the floating gate of the memory cell, and the distribution A is maintained. As a result, the distribution of the threshold value of the memory cell is divided into the distribution A of data "11" (the erasing state) and the distribution B of data "10" (see reference symbol (I) in FIG. 5).

Next, if the upper-order bit of the write data is "0", an electron is injected into the floating gate of the memory cell, and the threshold value is thereby shifted from the distribution A to the distribution D and from the distribution B to the distribution C. On the contrary, the upper-order bit is "1", an electron is suppressed from being injected into the floating gate of the memory cell, and the distribution A and the distribution B are maintained. As a result, the distribution of the threshold value of the memory cell is divided into the distribution A of data "11" (the erasing state), the distribution B of data "10", the distribution C of data "00" and the distribution D of data "01" (see reference symbol (II) in FIG. 5).

It is to be noted that the data "10" is referred to as lower-order level data and the data "00" and "01 are referred to as upper-order level data in this specification.

FIRST EXAMPLE

Figure 6:
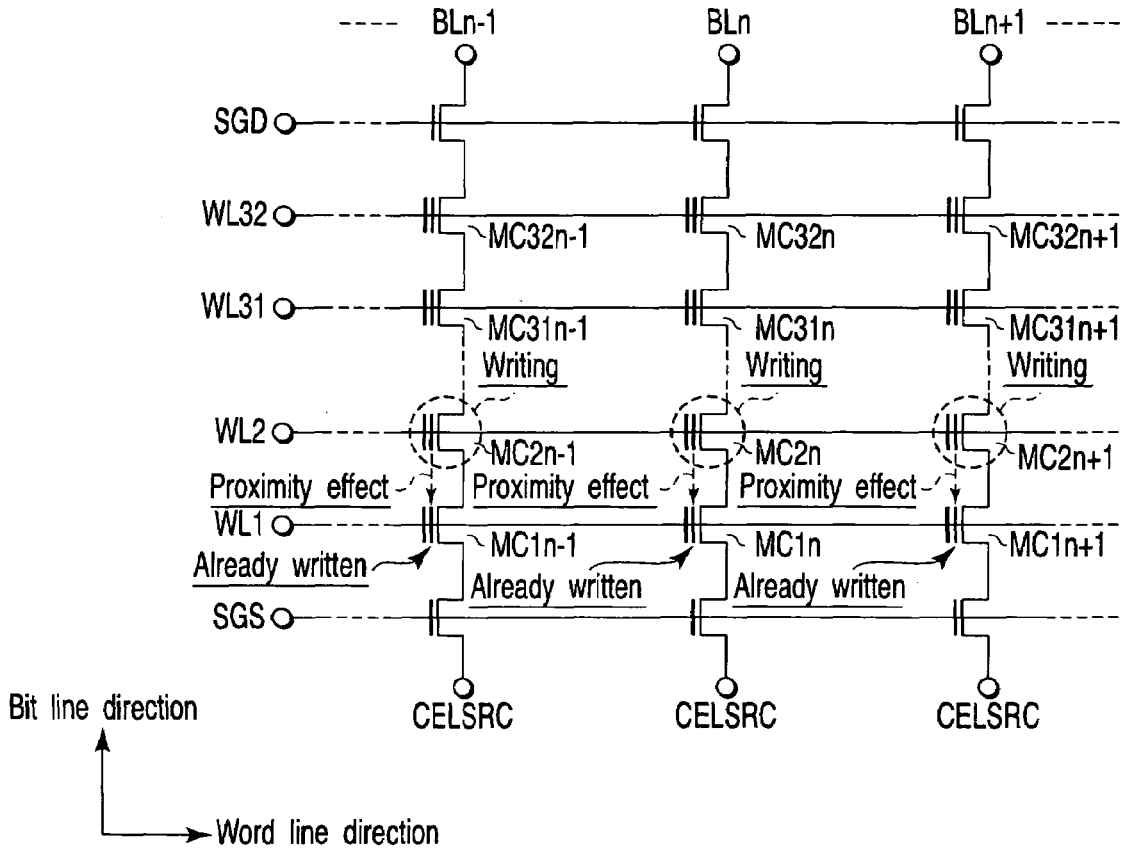
FIG. 6 is a circuit diagram showing a first example of a semiconductor integrated circuit device according to a first embodiment of the present invention.

FIG. 6 is a circuit diagram showing a first example of the semiconductor integrated circuit device according to the first embodiment of the present invention.

As shown in FIG. 6, data has been already written in memory cells ( . . . , MC1n−1, MC1n, MC1n+1, . . . ) connected with a word line WL1, and data is then written in memory cells ( . . . , MC2n−1, MC2n, MC2n+1, . . . ) connected with a word line WL2. This operation will now be described.

It is to be noted that a read operation and an erasing operation may be, e.g., the same as conventional operations in this example. Therefore, a write operation alone will be described in this example.

(Write Operation)

First, data "11", data "10", data "00" and data "01" are written in the memory cells ( . . . , MC1n−1, MC1n, MC1n+1, . . . ) connected with the word line WL1. As a concrete example, the lower-order level data "10" is first written and then the upper-order level data "00" and "01" are written in accordance with the write data as described above.

Then, like the example of the word line WL1, the lower-order level data "10" is written and then the upper-order level data "00" and "01" are written in the memory cells ( . . . , NC2n−1, MC2n, MC2n+1, . . . ) connected with the word line WL2. The memory cells ( . . . , MC1n−1, MC1n, MC1n+1, . . . ) connected with the word line WL1 undergo the proximity effect by this write operation.

Thus, in this example, additional writing is performed with respect to the memory cells ( . . . , MC1n−1, MC1n, MC1n+1, . . . ). Electrons are injected into floating gates of the memory cells ( . . . , MC1n−1, MC1n, MC1n+1, . . . ) by additional writing, and threshold levels of these memory cells are thereby increased. As a result, each threshold distribution width which has been increased due to the proximity effect can be corrected to be again narrowed.

An example of the write operation utilizing additional writing will now be described.

Figure 7:
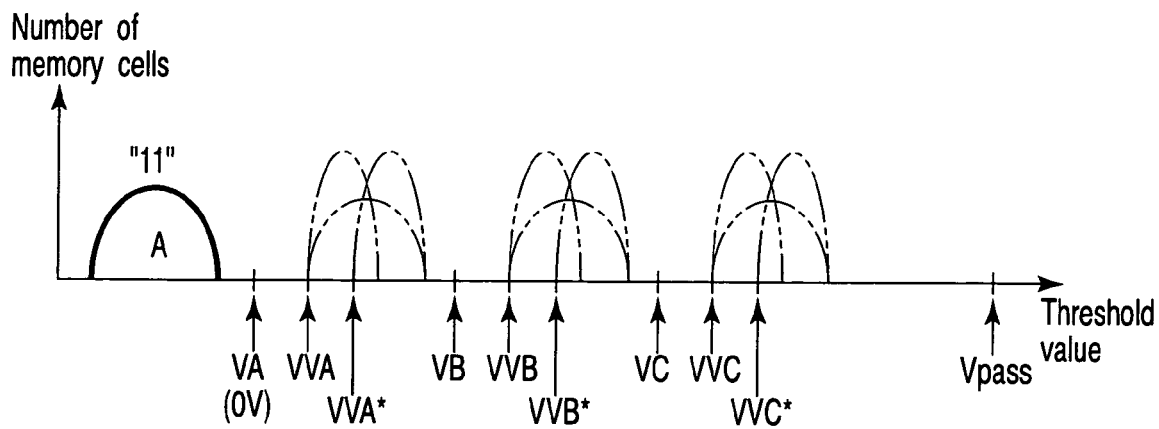
FIG. 7 is a view showing an example of a setting of a verify voltage.

FIG. 7 shows an example of a setting of a verify voltage.

As shown in FIG. 7, in this example, considering execution of additional writing after writing, two voltages, i.e., a writing verify voltage VV and an additional writing verify voltage VV* are set as the verify voltages. It is to be noted that writing performed before additional writing will be referred to as regular writing, and a verify voltage used in regular writing will be referred to as a regular writing verify voltage VV. In this example, as the regular writing verify voltages VV, a verify voltage VVA which specifies a lower limit of the distribution B, a verify voltage VVB which specifies a lower limit of the distribution C and VVC which specifies a lower limit of the distribution D are set. Further, as the additional writing verify voltages VV*, verify voltages VVA*, VVB* and VVC* are set. The verify voltage VVA* specifies a lower limit of the distribution B after additional writing. Likewise, the verify voltage VVB* specifies a lower limit of the distribution C after additional writing, and the verify voltage VVC* specifies a lower limit of the distribution C after additional writing.

Figure 8:
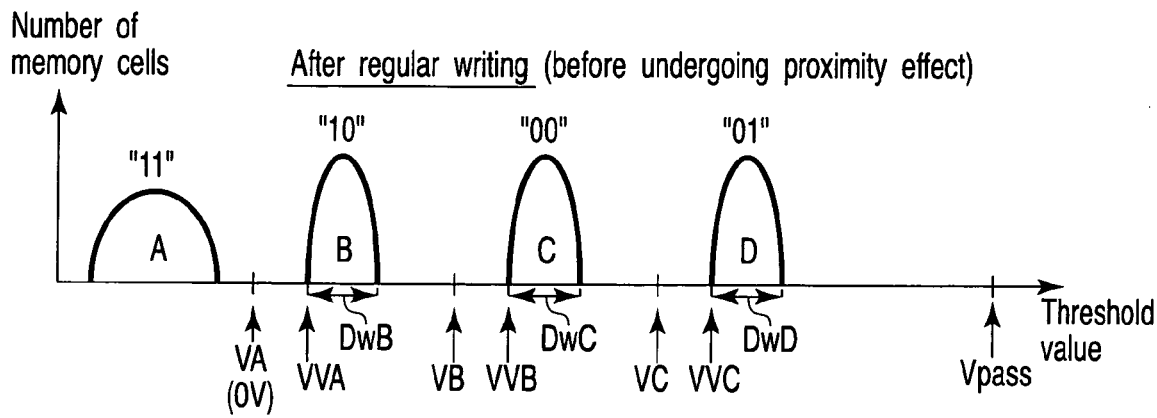
FIG. 8 is a view showing threshold distributions before undergoing the proximity effect.
Figure 9:
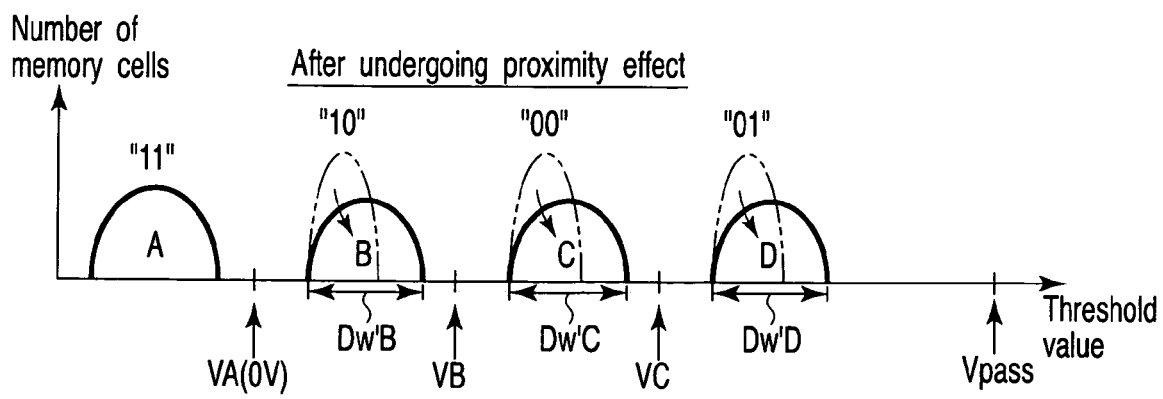
FIG. 9 is a view showing threshold distributions after undergoing the proximity effect.
Figure 10:
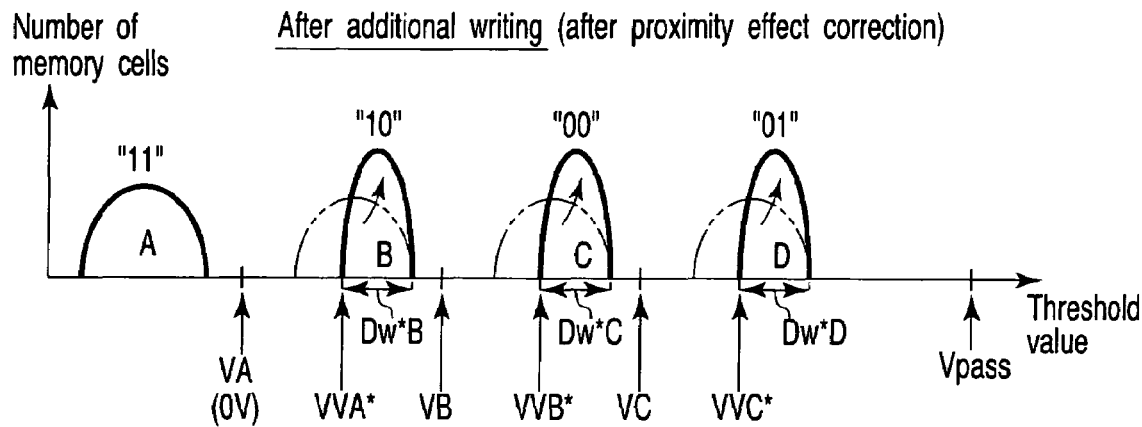
FIG. 10 is a view showing threshold distributions after additional writing.

In this example, the regular writing verify voltage VV is set to be lower than the additional writing verify voltage VV*. In regular writing, verify reading is carried out by using the regular writing verify voltages VVA, VVB and VVC. In additional writing, verify reading is performed by using the additional writing verify voltages VVA*, VVB* and VVC*. FIG. 8 shows an example of threshold distributions after regular writing (before undergoing the proximity effect), FIG. 9 shows an example of threshold distributions after undergoing the proximity effect, and FIG. 10 shows an example of threshold distributions after additional writing (after proximity effect correction).

In this manner, according to the semiconductor integrated circuit device according to the first embodiment, after regular writing, additional writing is performed with respect to memory cells which have undergone the proximity effect. As a result, each threshold distribution width Dw' which has been increased due to the proximity effect can be corrected to be again narrowed (Dw*B<Dw'B, Dw*C<Dw'C, Dw*D<Dw'D). Therefore, it is possible to provide a semiconductor integrated circuit device having a non-volatile semiconductor memory which can realize narrow threshold distribution widths.

SECOND EXAMPLE

A second example relates to an example where the proximity effect is given between memory cells adjacent to each other in a word line direction.

Figure 11:
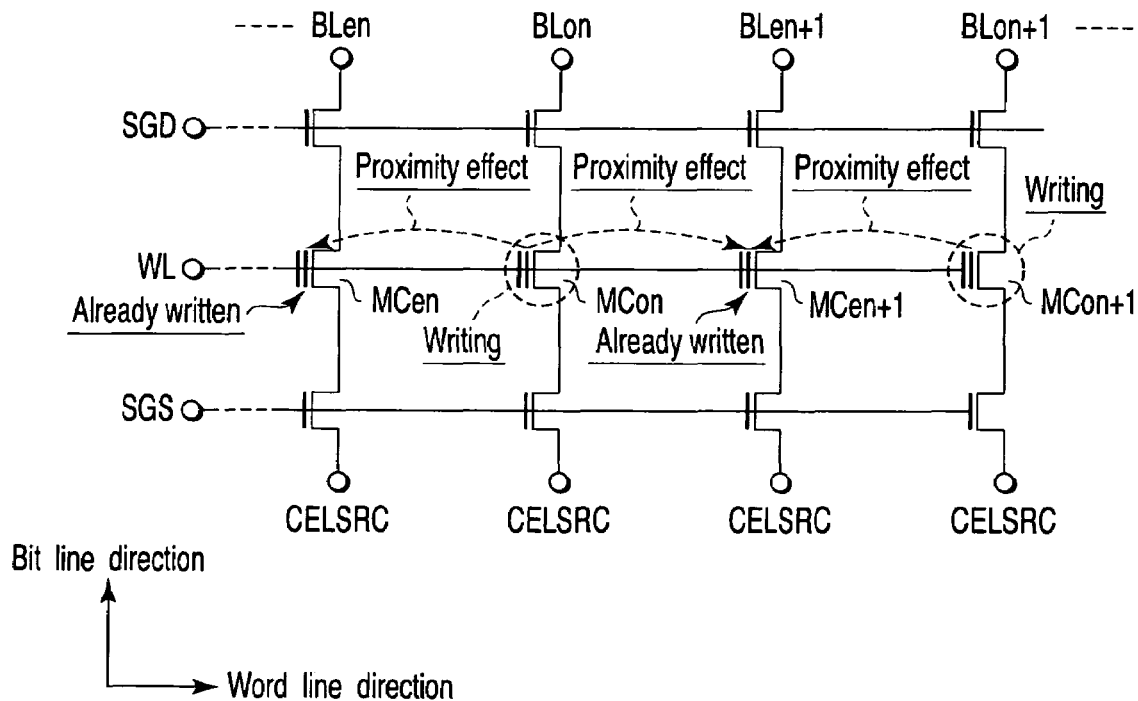
FIG. 11 is a circuit diagram showing a second example of the semiconductor integrated circuit device according to the first embodiment of the present invention.

FIG. 11 is a circuit diagram showing the second example of the semiconductor integrated circuit device according to the first embodiment of the present invention.

As shown in FIG. 11, data has been already written in memory cells ( . . . , MCen, MCen+1, . . . ) connected with a word line WL and also connected with even-numbered bit lines (BLe), and data is then written in memory cells ( . . . , MCon, MCon+1, . . . ) connected with the word line WL and also connected with odd-numbered bit lines (BLo). This operation will now be explained.

It is to be noted that a read operation and an erasing operation may be, e.g., the same as conventional operations in this example. Therefore, a write operation alone will be described in this example.

(Write Operation)

First, like the first embodiment, lower-order level data "10" is written and then upper-order level data "00" and "01" are written in the memory cells MCe ( . . . , MCen, MCen+1, . . . ) connected with the word line WL and the even-numbered bit lines BLe ( . . . , BLen, BLen+1, . . . ) in accordance with write data.

Subsequently, the lower-order level data "10" is written and the upper-order level data "00" and "01" are written in the memory cells MCo ( . . . , MCon, MCon+1, . . . ) connected with the word line WL and the odd-numbered bit lines BLo ( . . . , BLon, BLon+1, . . . ) in accordance with the write data. The memory cells MCe ( . . . , MCen, MCen+1, . . . ) undergo the proximity effect by this writing.

In this example, additional writing is performed with respect to the memory cells MCe ( . . . , MCen, MCen+1, . . . ). Electrons are injected into floating gates of the memory cells MCe ( . . . , MCen, MCen+1, . . . ) by additional writing, and threshold levels of these memory cells are thereby increased.

It is to be noted that settings of a regular writing verify voltage VV and an additional writing verify voltage VV* in the second example may be the same as those in the first embodiment.

In the semiconductor integrated circuit device according to the second example, likewise, additional writing is performed with respect to the memory cells which have undergone the proximity effect after regular writing. Therefore, each threshold distribution width which has been increased due to the proximity effect can be corrected to be again narrowed. Accordingly, like the first example, it is possible to provide a semiconductor integrated circuit device having a non-volatile semiconductor memory which can realize narrow threshold distribution widths.

THIRD EXAMPLE

This example relates to an example in which the proximity effect is given between memory cells adjacent to each other in a bit line direction and between memory cells adjacent to each other in a word line direction.

Figure 12:
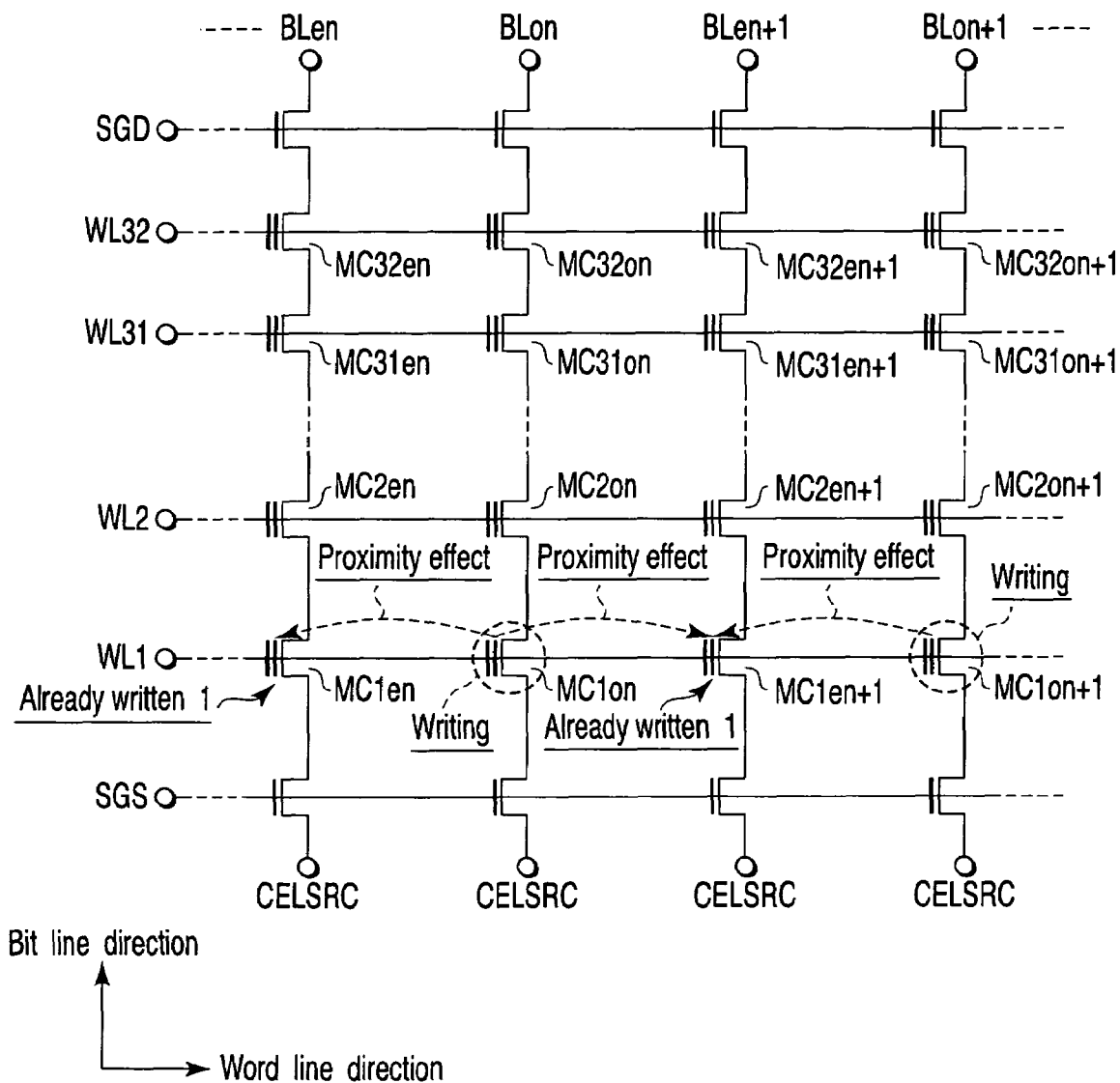
FIG. 12 is a circuit diagram showing a third example of the semiconductor integrated circuit device according to the first embodiment of the present invention.
Figure 13:
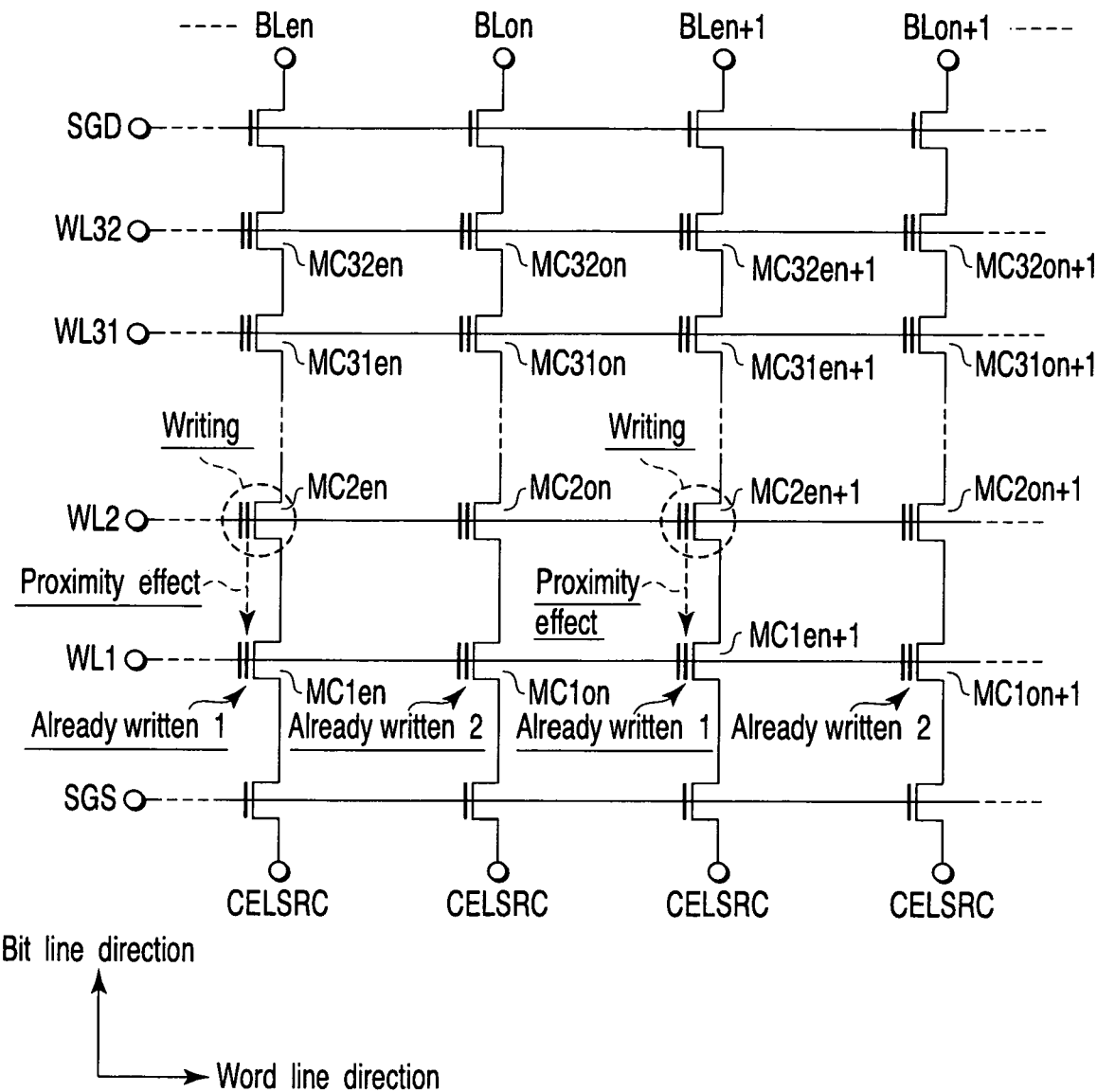
FIG. 13 is a circuit diagram showing the third example of the semiconductor integrated circuit device according to the first embodiment of the present invention.

FIGS. 12 and 13 are circuit diagrams showing a third example of the semiconductor integrated circuit device according to the first embodiment of the present invention.

First, as shown in FIG. 12, data has been already written in memory cells ( . . . , MC1en, MC1en+1, . . . ) connected with a word line WL1 and also connected with even-numbered bit lines (BLe), and then data is written in memory cells ( . . . , MC1on, MC1on+1, . . . ) connected with the word line WL1 and also connected with odd-numbered bit lines (BLo). Subsequently, as shown in FIG. 13, data is written in memory cells ( . . . , MC2en, MC2en+1, . . . ) connected with a word line WL2 and even-numbered bit lines (BLe). This operation will now be described.

It is to be noted that a read operation and an erasing operation may be, e.g., the same as conventional operations in this example. Therefore, a write operation alone will be described in this example.

(Write Operation)

First, as shown in FIG. 12, like the first embodiment, lower-order level data "10" is written and then upper-order level data "00" and "01" are written in the memory cells MC1e ( . . . , MC1en, MC1en+1, . . . ) connected with the word line WL1 and the even-numbered bit lines BLe ( . . . , BLen, BLen+1, . . . ) in accordance with write data.

Then, the lower-order level data "10" is written and the upper-order level data "00" and "01" are written in the memory cells MC1o ( . . . , MC1on, MC1on+1, . . . ) connected with the word line WL1 and the odd-numbered bit lines BLo ( . . . , BLon, BLon+1, . . . ) in accordance with the write data. The memory cells MC1e ( . . . , MC1en, MC1en+1, . . . ) undergo the first proximity effect by this writing.

Subsequently, as shown in FIG. 13, like the first embodiment, the lower-order level data "10" is written and then the upper-order level data "00" and "01" are written in the memory cells MC2e ( . . . , MC2en, MC2en+1, . . . ) connected with the word line WL2 and the even-numbered bit lines BLe ( . . . , BLen, BLen+1, . . . ) in accordance with the write data. The memory cells MC1e ( . . . , MC1en, MC1en+1, . . . ) undergo the second proximity effect by this writing.

In this example, additional writing is performed with respect to the memory cells MC1e ( . . . , MC1en, MC1en+1, . . . ). Electrons are injected into floating gates of the memory cells MC1e ( . . . , MC1en, MC1en+1, . . . ) by additional writing, and threshold levels of these memory cells are thereby increased.

It is to be noted that settings of a regular writing verify voltage VV and an additional writing verify voltage VV* in the third embodiment may be the same as those in the first embodiment.

In the semiconductor integrated circuit device according to the third embodiment, likewise, additional writing is carried out with respect to memory cells which have undergone the proximity effect after regular writing. Therefore, each threshold distribution width which has been increased due to the proximity effect can be corrected to be again narrowed. Accordingly, like the first and second examples, it is possible to provide a semiconductor integrated circuit device having a non-volatile semiconductor memory which can realize narrow threshold distribution widths.

SECOND EMBODIMENT

A second embodiment is an example concerning a timing at which additional writing is started.

Figure 14:
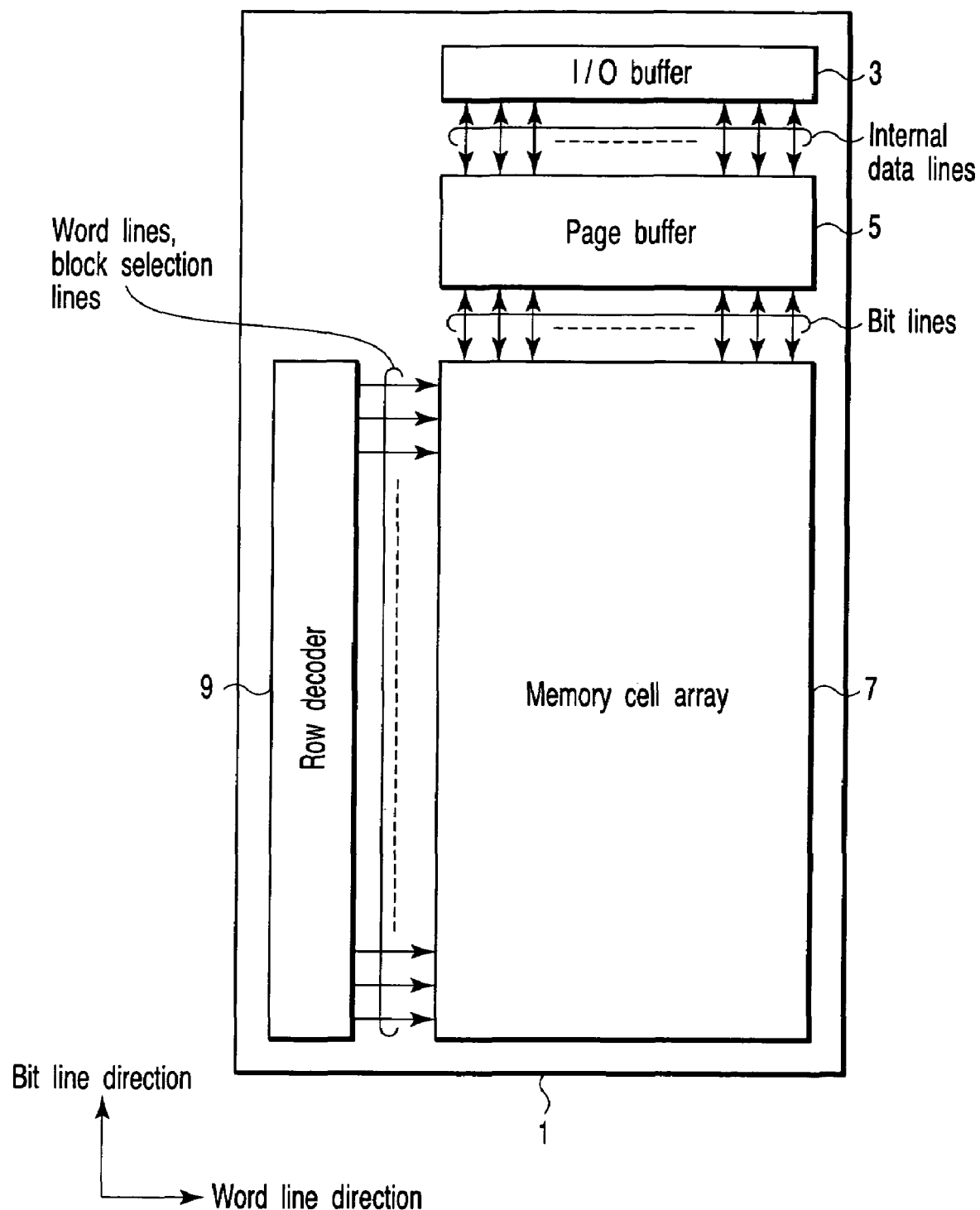
FIG. 14 is a block diagram showing a schematic configuration of a NAND type flash memory.

FIG. 14 is a block diagram showing a schematic configuration of a NAND type flash memory.

As shown in FIG. 14, an I/O buffer 3, a page buffer 5, a memory cell array 7 and a row decoder 9 are arranged in a semiconductor integrated circuit chip 1. It is to be noted that FIG. 14 shows a schematic structural example, and illustrates a basic data input path and data output path alone. Therefore, a command decoder which decodes a command, a status register which holds a status of a memory, a control circuit and others are eliminated in FIG. 14.

The I/O buffer 3 is an electrical contact point between the chip 1 and an external electronic device provided outside the chip 1. For example, write data is input to the chip 1 from the external electronic device through the I/O buffer 3. Furthermore, read data is output to the external electronic device from the chip 1 through the I/O buffer. The I/O buffer 3 is electrically connected with the page buffer 5 through internal data lines.

The page buffer 5 is a circuit which holds write data which is written in the memory cell array 7 and corresponds to one page. Moreover, it is a circuit which holds read data which is read from the memory cell array 7 and corresponds to one page. Therefore, the page buffer 5 includes a circuit called a data cache which temporarily holds data. An example of the data cache is a latch circuit, and the latch circuit latches read data corresponding to one page or write data corresponding to one page. The page buffer 5 is electrically connected with the memory cell array 7 through bit lines.

Figure 15:
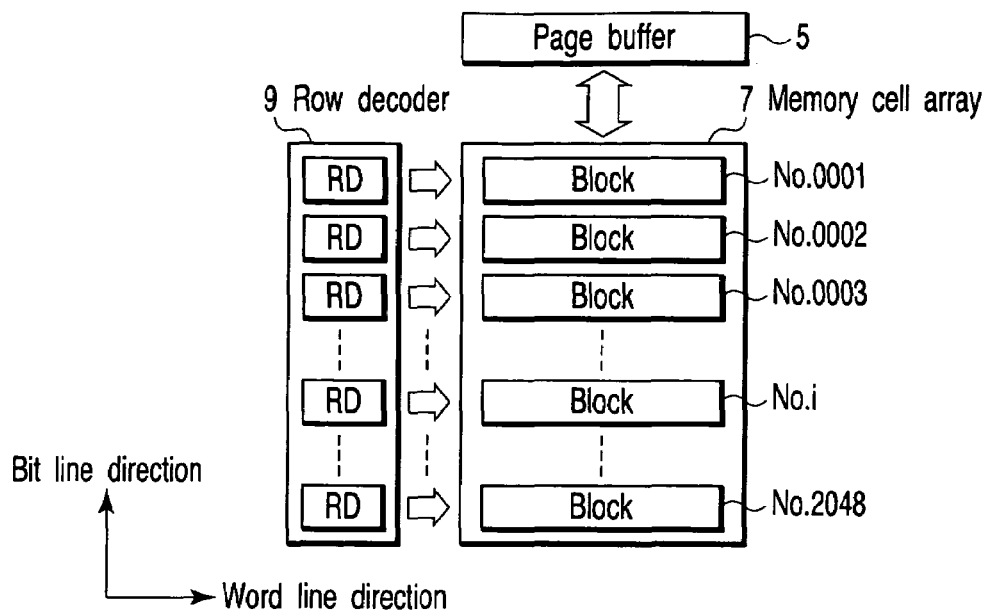
FIG. 15 is a view showing an example of a memory cell array.

FIG. 15 is a view showing an example of the memory cell array.

Figure 16:
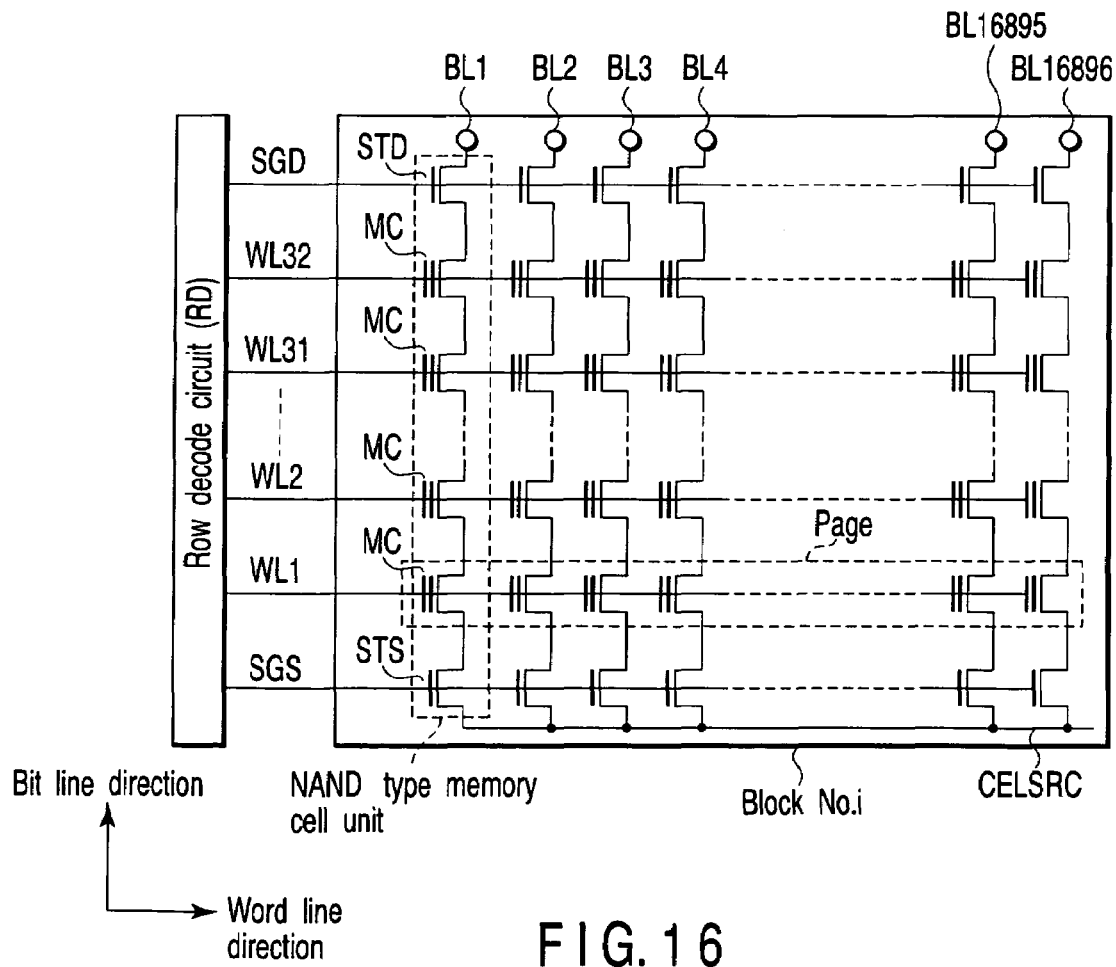
FIG. 16 is an equivalent circuit diagram showing an example of a block.

As shown in FIG. 15, the memory cell array 7 in the NAND type flash memory includes a plurality of blocks. In this example, the memory cell array 7 includes 2048 blocks No. 0001 to No. 2048. The block constitutes a minimum unit for data erasing. FIG. 16 shows an equivalent circuit example of the block.

As shown in FIG. 16, one block No. i includes a plurality of NAND type memory cell units. In this example, one block No. i includes 16896 NAND type memory units. The NAND type memory cell unit includes a plurality of non-volatile semiconductor memory cells MC connected in series. In this example, the NAND type memory cell unit includes 32 memory cells MC. The 32 memory cells MC are connected in series between a drain-side block selection transistor STD and a source-side block selection transistor STS. On end of the NAND type memory cell unit is connected with a bit line BL through the selection transistor STD, and the other end of the NAND type memory cell unit is connected with a common source line CELSRC through the selection transistor STS. A gate of the selection transistor STD is connected with a drain-side block selection gate line SGD. A gate of the selection transistor STS is connected with a source-side block selection gate line SGS. A gate (a control gate) of the memory cell MC is connected with a word line WL. The block selection lines SGD and SGS and the word line WL are connected with a row decode circuit RD of the row decoder 9. The row decode circuit RD decodes a row address and selects the block selection lines SGD and SGS and the word line WL.

In this example, reading and writing of data are simultaneously carried out with respect to the 16896 memory cells MC connected with one word line WL. In a case where one memory cell MC stores data consisting of one bit (a two-valued memory), the 16896 memory cells MC constitute a unit called a page. The page constitutes, e.g., a minimum unit for data reading and writing. In a case where one memory cell MC stores data consisting of two bits (a four-valued memory), the 16896 memory cells store data corresponding to two pages.

Additional data writing may be performed after writing in one of a plurality blocks is finished, or may be carried out after writing in one of a plurality of pages is finished. Some examples of a write operation will now be described.

FIRST EXAMPLE

This example is an example where additional writing is carried out after regular writing in one block is finished.

Figure 17:
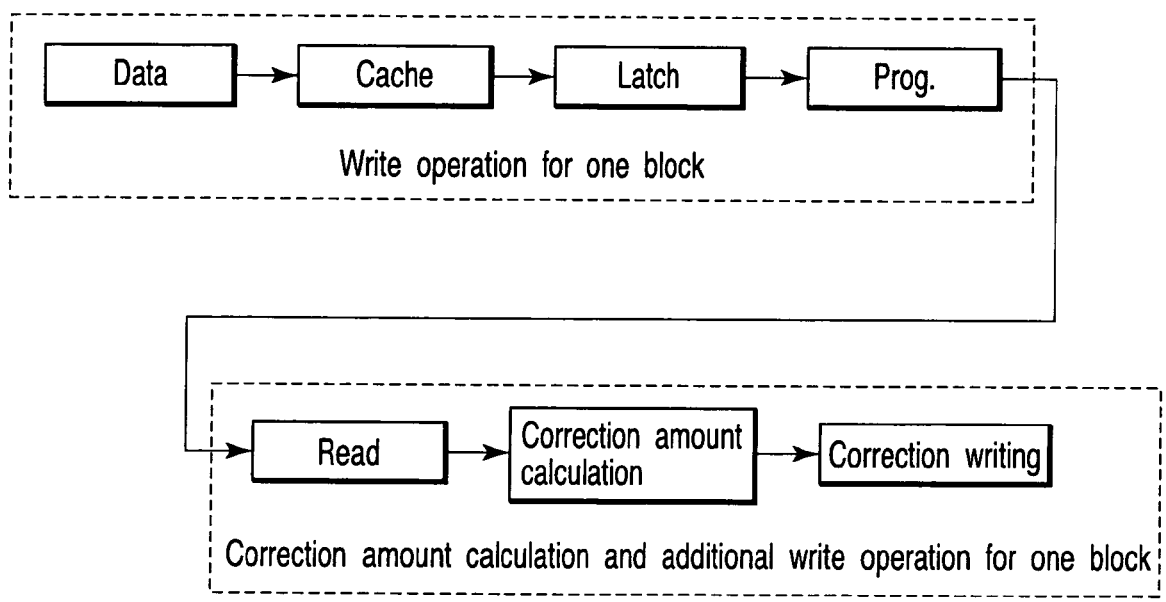
FIG. 17 is a view showing a first example of a writing method according to a second embodiment of the present invention.

FIG. 17 is a view showing a procedure example of a writing method according to a first example of the second embodiment.

When the integrated circuit receives a write command, a writing start flag is set in a control circuit system of the integrated circuit. In this example, when the writing start flag is set, operations other than the write operation are inhibited.

<Regular Write Operation>

When the writing start flag is set, the regular write operation is started. A procedure of the regular write operation in this example is as follows.

As shown in FIG. 17, write data, e.g., write data corresponding to one page is loaded in a data cache in a page buffer (Data→Cache). Then, the loaded data is latched in the data cache (Cache→Latch). Subsequently, data is written in a specified page in accordance with the latched data (Latch→Prog) When writing of data corresponding to one page is finished, the operation shifts to writing of next data corresponding to one page, and the regular write operation is repeated. In this example, writing is repeated from a page closest to the source line toward the drain side in a block until the regular write operation of one block is finished. When regular writing of one block is finished, a writing end flag is set in the control circuit system. When the writing end flag is set, an additional writing start flag is then set.

<Additional Write Operation>

When the additional write start flat is set, the additional write operation is started. A procedure of the additional write operation in this example is as follows.

As shown in FIG. 17, data is read from the block in which regular writing has been finished. In this example, data is read from a page closest to the source line (a page of the word line WL1 in this example). Subsequently, data is read from the next page (a page of the word line WL2 in this example) (READ). Then, the page data of the word line WL1 is compared with the page data of the word line WL2, and an additional writing amount which is given to the page data of the word line WL1, i.e., a threshold correction amount is thereby determined in this example (correction amount calculation). The threshold correction amount is determined in accordance with each memory cell MC connected with the word line WL1. Then, data is additionally written in the memory cells MC connected with the word line WL1 based on the determined threshold correction amount, thereby correcting each threshold value (correction writing).

When additional writing of the page data in the word line WL1 is finished, the additional write operation is repeated. That is, data is read from the next page (a page of the word line WL3 in this example). The page data of this word line WL3 is compared with the previously read page data of the word line WL2, and an additional write amount which is given to the page data of the word line WL2, i.e., a threshold correction amount in this example is thereby determined. Such an additional write operation is repeated until additional writing with respect to the page data of the word line WL31 is finished. Further, in this example, additional writing is also carried out with respect to the page data of the word line WL32. The page data of the word line WL32 to which usual writing has been performed at last does not undergo the proximity effect. Additional writing does not have to be performed with respect to the page data which is not affected by the proximity effect. However, if additional writing is executed with respect to the page data which does not undergo the proximity effect, a threshold value difference between the page data which does not undergo the proximity effect and the page data which undergoes the proximity effect can be reduced. FIG. 18A shows threshold value distributions of cells which are not affected by the proximity effect, and FIG. 18B shows threshold distributions of cells which undergo the proximity effect. As shown in FIG. 18A, when additional writing is carried out with respect to each cell which is not affected by the proximity effect, its threshold distribution can be set to be substantially equal to a threshold value of a cell which undergoes the proximity effect (a cell to which additional writing is performed). As a result, as shown in FIG. 18C, threshold distribution widths Dw*B, Dw*C and Dw*D can be narrowed. As reference examples, FIGS. 19A to 19C show a case where additional writing is not performed to each cell which is not affected by the proximity effect. As shown in FIG. 19C, in this case, since additional writing is not executed to each cell which is not affected by the proximity effect, the threshold distribution widths Dw*B, Dw*C and Dw*D become wider than those in the example depicted in FIG. 18C.

When additional writing in one block is finished, an additional writing end flag is set.

According to the first example, since additional writing is also performed with respect to page data which is not affected by the proximity effect, the threshold distribution widths Dw*B, Dw*C and Dw*D can be particularly reduced as shown in FIG. 18C. When the threshold distribution widths Dw*B, Dw*C and Dw*D are reduced, an advantage, e.g., suppressing data from changing into another data can be obtained, thereby improving reliability concerning data holding.

As a technique of obtaining narrow threshold distribution widths, there is known pass-write writing (a reference: Jpn. Pat. Appln. KOKAI Publication No. 2003-196988). In pass-write writing, when a threshold value of a memory cell approximates a predetermined write level, a step-up voltage width of a word line is reduced. In pass-write writing, a step-up voltage width is reduced, and a threshold shift amount per write pulse is decreased, thereby softly landing on the predetermined write level. According to pass-write writing, a narrow threshold distribution width can be obtained. However, in order to acquire a narrower threshold distribution width, a step-up voltage width must be further reduced. When pass-write writing alone is used, the number of times of write pulse application is increased, whereby a data write time tends to become long.

On the other hand, according to the first example, a narrow threshold distribution width can be obtained by performing additional writing. In the first example, a data write time can be reduced as compared with pass-write writing. Of course, the first example can use both additional writing and pass-write writing. Even in a case where both additional writing and pass-write writing are used, a data write time can be reduced as compared with writing using pass-write writing alone.

Furthermore, in the first example, when the additional writing start flag is set, additional writing is started. While the additional writing start flag is being set, operations other than additional writing can be inhibited. Inhibiting operations other than additional writing can decrease a possibility of erroneous additional writing.

Moreover, in the first example, when additional writing is finished, the additional writing end flag is set. Detecting the additional writing end flag can be used to judge whether additional writing is completely finished. Operations other than additional writing may be carried out after the additional writing end flag is set.

SECOND EXAMPLE

A second example is an example in which additional writing is performed after regular writing in one block is finished. A particular difference lies in that a calculation circuit which calculates an additional writing amount and a circuit which stores the calculated additional writing amount are provided separately from the data cache. A description will be mainly given as to differences of the second example.

<Regular Write Operation>

Figure 20:
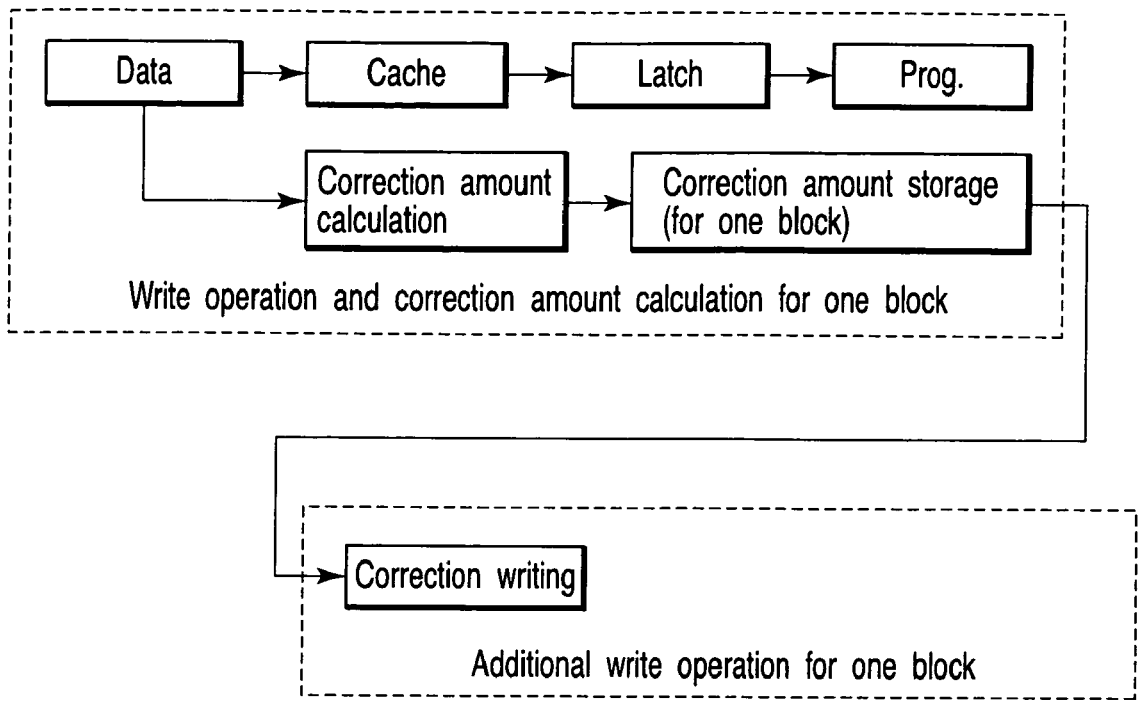
FIG. 20 is a view showing a second example of a writing method according to the second embodiment of the present invention.

As shown in FIG. 20, write data, e.g., write data corresponding to a first page is loaded in a data cache in a page buffer (Data→Cache). The write data corresponding to the first page is loaded in a calculation circuit which calculates an additional writing amount (correction amount calculation) simultaneously with the above-described loading. The write data which is loaded first is page data of the word line WL1.

The calculation circuit does not perform correction amount calculation. Then, the loaded write data is latched in the data cache, and data is written in the page of the word line WL1 in accordance with the latched data (Cache→Latch→Prog.).

When writing the data corresponding to one page is finished, data corresponding to the next page is written. Like the above-described operation, the write data corresponding to the next one page is loaded in the data cache and the calculation circuit. The calculation circuit compares the previously loaded page data of the word line WL1 with the currently loaded page data of the word line WL2, and thereby determines an additional writing amount which is given to the page data of the word line WL1, i.e., a threshold correction amount in this example (correction amount calculation). The determined threshold correction amount is stored in a correction amount storage circuit (correction amount storage (corresponding to one block)).

The regular writing and the correction amount calculation/correction amount storage operation are repeated until processing for one block is finished.

<Additional Write Operation>

When writing in one block is finished, additional writing is started. In this example, additional writing is sequentially performed from the word line WL1 closest to the source line toward the word line WL32 closest to the bit line in accordance with the threshold correction amount stored in the correction amount storage circuit. Upon completion of additional writing for one block, if there is the next block, the regular write operation and this additional write operation are repeated for the next block.

According to the second example, the same effects as those of the first example can be obtained, and the correction amount calculation is executed simultaneously with regular writing, thereby reducing a write time as compared with the first example.

THIRD EXAMPLE

This example is an example of executing the operation concerning the first example in accordance with each page.

Figure 21:
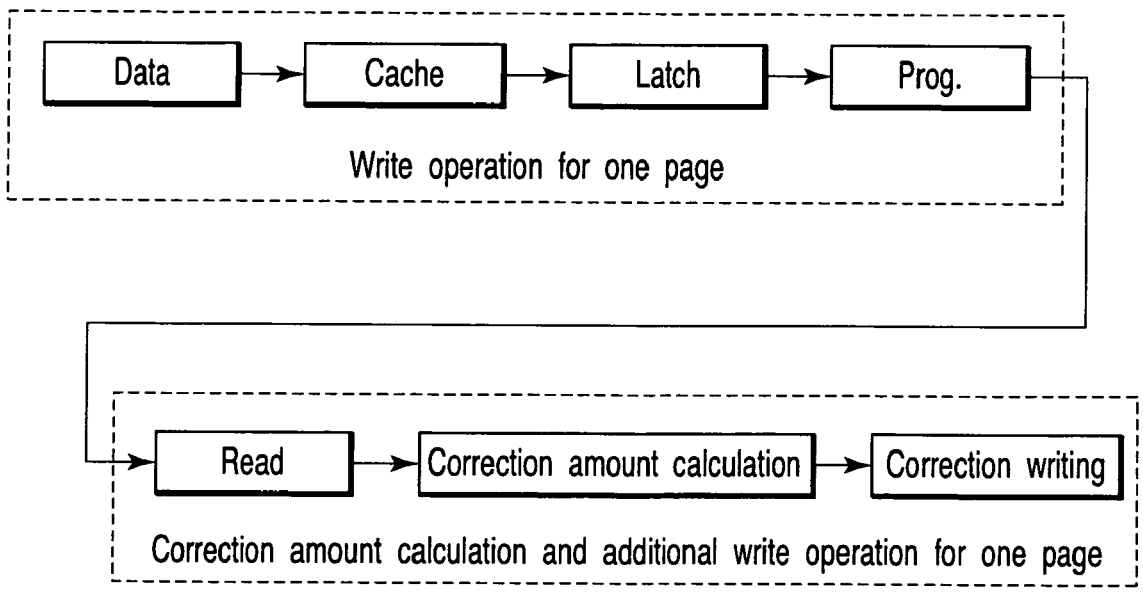
FIG. 21 is a view showing a third example of the writing method according to the second embodiment of the present invention.

As shown in FIG. 21, the operation concerning the first example can be executed in accordance with each page.

FOURTH EXAMPLE

This example is an example of executing the operation concerning the second example in accordance with each page.

Figure 22:
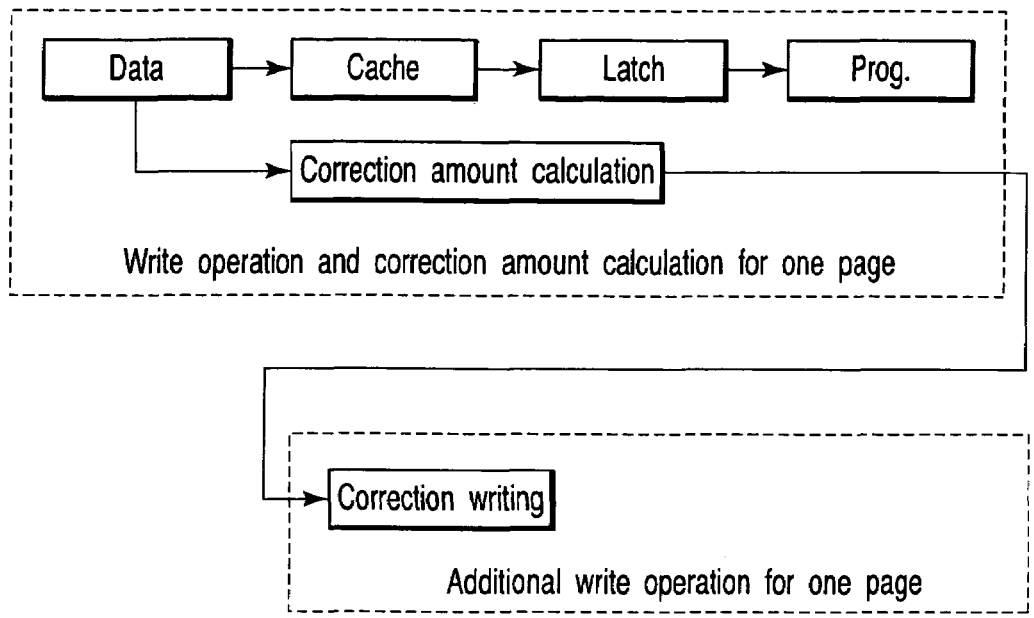
FIG. 22 is a view showing a fourth example of the writing method according to the second embodiment of the present invention.

As shown in FIG. 22, the operation concerning the second example can be executed in accordance with each page.

FIFTH EXAMPLE

Figure 23:
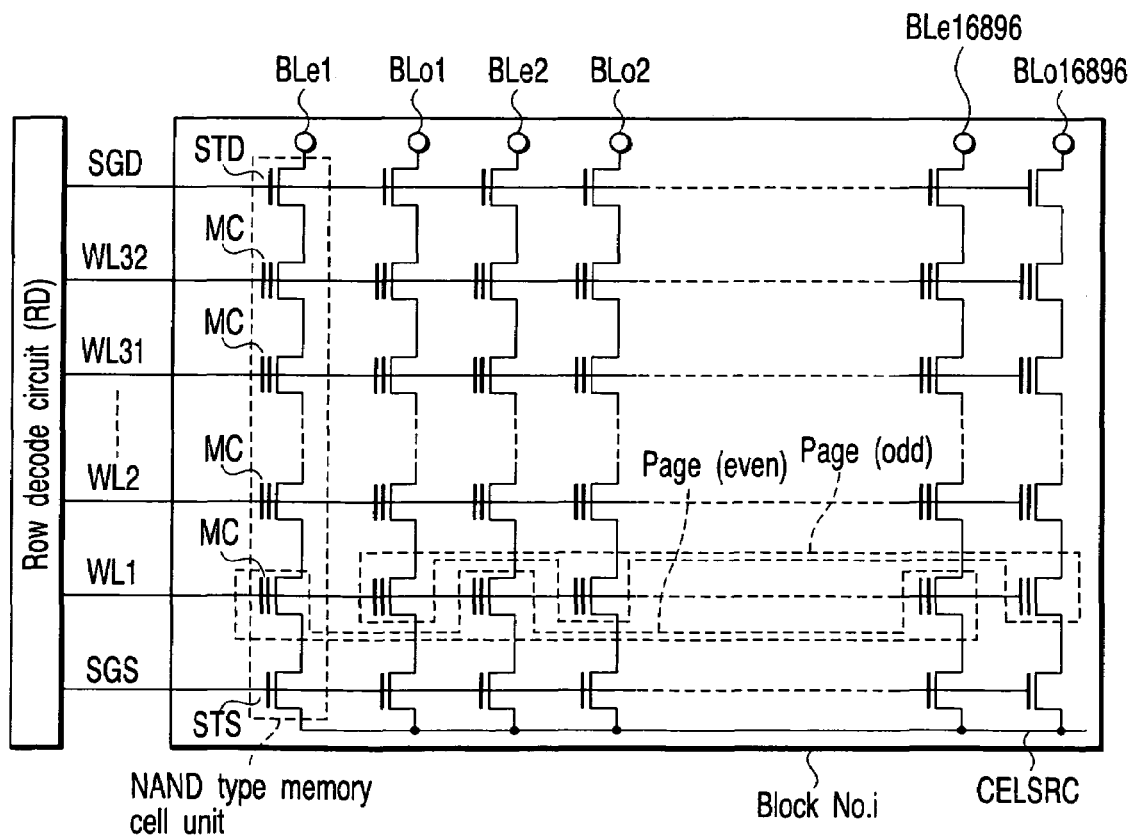
FIG. 23 is an equivalent circuit diagram showing another example of the block.

As shown in FIG. 23, the fifth example is an example in which bit lines are divided into even-numbered lines and odd-numbered lines. The operations concerning the first to fourth examples of the second embodiment can be also applied to a NAND type flash memory in which a plurality of pages are provided to one word line.

THIRD EMBODIMENT

Speaking strictly, a fluctuation amount of a threshold value due to the proximity effect varies depending on data written in an adjoining memory cell.

A third embodiment relates to a technique which judges whether additional writing is performed in accordance with data written in an adjoining memory cell.

FIRST EXAMPLE

This example is an example in which the proximity effect occurs between memory cells which are adjacent to each other along a word line direction. In this example, the proximity effect is corrected between memory cells which are adjacent to each other along the word line direction, but the proximity effect is not corrected between memory cells which are adjacent to each other along a bit line direction.

Figure 24:
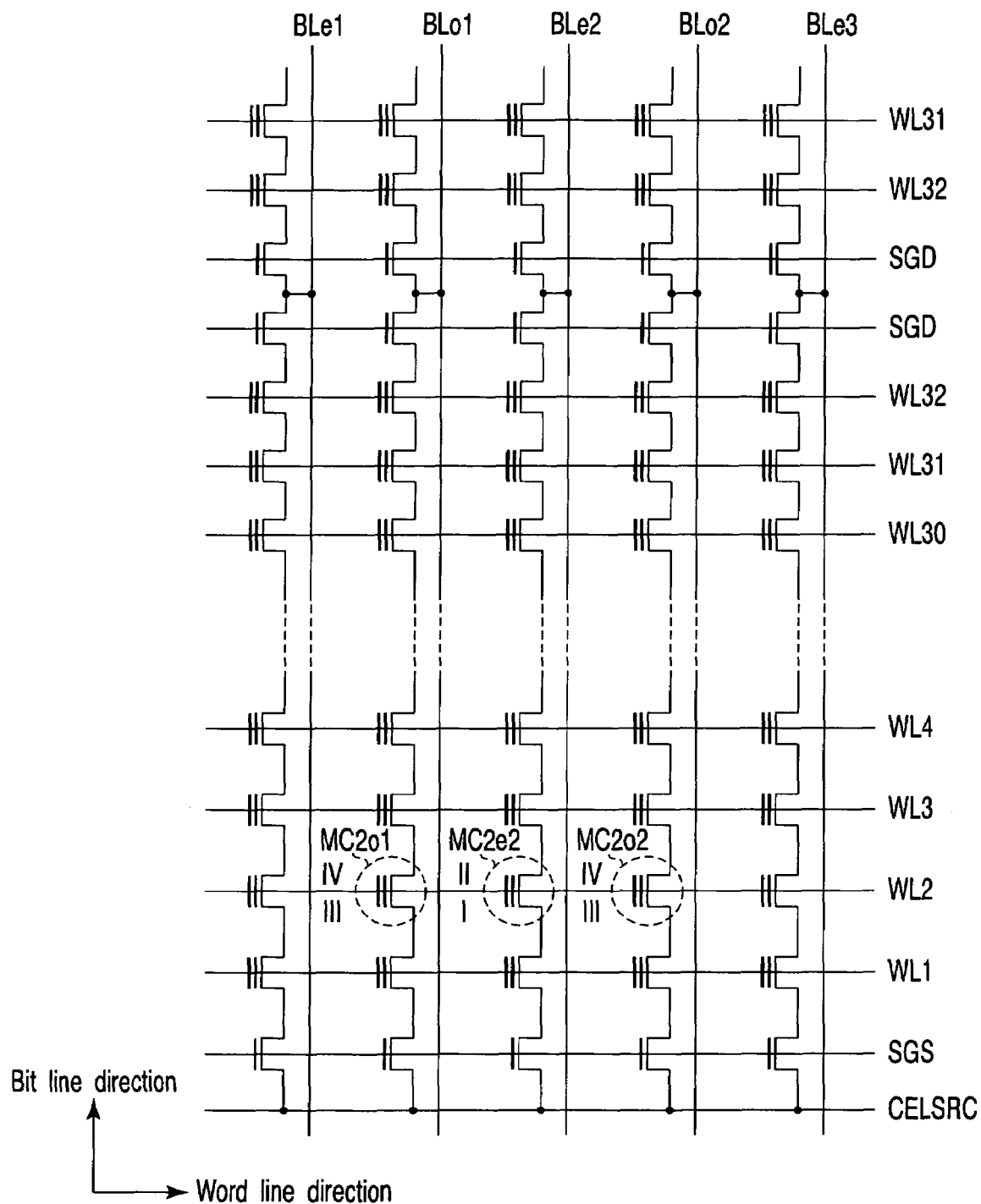
FIG. 24 is a view showing a first example of a writing method according to a third embodiment of the present invention.

As shown in FIG. 24, it is assumed that data is written in three memory cells MC2o1, MC2e2, MC2o2 which are connected with a word line WL2. The memory cells MC2o1 and MC2o2 are respectively connected with the word line WL2 and an odd-numbered bit line BL2o1 and with the word line WL2 and an odd-numbered bit line BL2o2, and the memory cell MC2e2 is connected with the word line WL2 and an even-numbered bit line BLe2. In regard to a writing order, data is written in the memory cell MC2e2 (I, II), and then data is written in the memory cells MC2o1 and MC2o2 (III, IV). In this example, as modes in which the memory cell MC2e2 is affected by the proximity effect, there are four cases (Case 1 to Case 4). Case 1 to Case 4 will now be described in order.

<Case 1>

Figure 25:
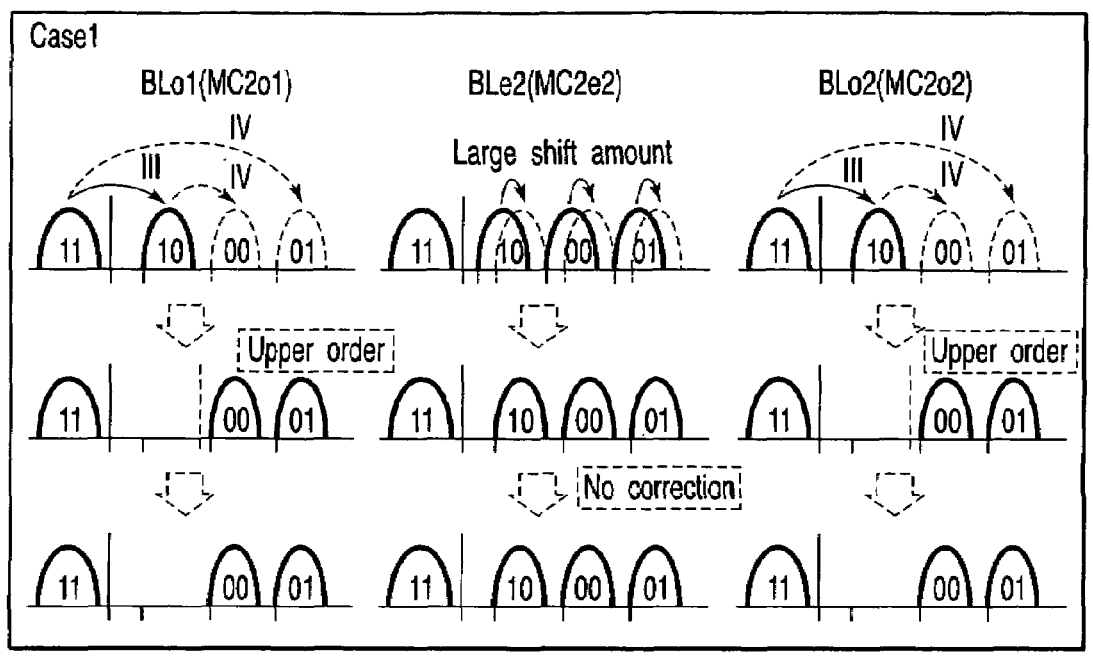
FIG. 25 is a view showing changes in threshold distributions according to the first example of the writing method of the third embodiment (Case 1)

As shown in FIG. 25, Case 1 is a case in which a level "00" or a level "01" is written in both the memory cells MC2o1 and MC2o2. Writing the level "00" or the level "01" will be referred to as "upper-order writing" in this specification. On the other hand, writing a level "10" will be referred to as "lower-order writing".

In Case 1, since upper-order writing is performed with respect to both the memory cells MC2o1 and MC2o2, more electrons are injected into floating gates of both the memory cells MC2o1 and MC2o2 as compared with the case of writing the level "10". In Case 1, both a floating gate potential of the memory cell MC2o1 and a floating gate potential of the memory cell MC2o2 are largely reduced. The influence of the proximity effect on the memory cell MC2e2 is the greatest in the first example. The floating gate potential of the memory cell MC2e2 is largely shifted to be reduced. A case in which a potential is largely shifted to be reduced will be referred to as a "large shift mount" in this specification.

Since Case 1 has the "large shift mount", additional writing (writing to correct the proximity effect) is not performed with respect to the memory cell MC2e2. The fact that additional writing is not carried out means that a shift of a threshold value is suppressed at the time of additional writing.

In order to judge a writing level of the memory cells MC2o1 and MC2o2, it is good enough to give an additional writing judgment level set between the level "10" and the level "00" to the word line WL after end of block writing, and read data. Alternatively, it is good enough to store information which is used to judge whether a upper-order level has been written in the memory cells MC2o1 and MC2o2 in, e.g., a storage circuit when data has been written in the memory cells MC2o1 and MC2o2. For example, the storage circuit may be a latch circuit separately provided from the memory cell array. It is good enough to obtain the information which is used to judge whether the upper-order level has been written from, e.g., write data loaded in the page latch or write data input to the I/O buffer. For example, information indicating whether a upper-order bit in write data is "0" or "1" is stored in the latch circuit. The level "10" has a upper-order bit which is "1". On the other hand, each of the level "00" and the level "01" has a upper-order bit which is <Case 2>

Figure 26:
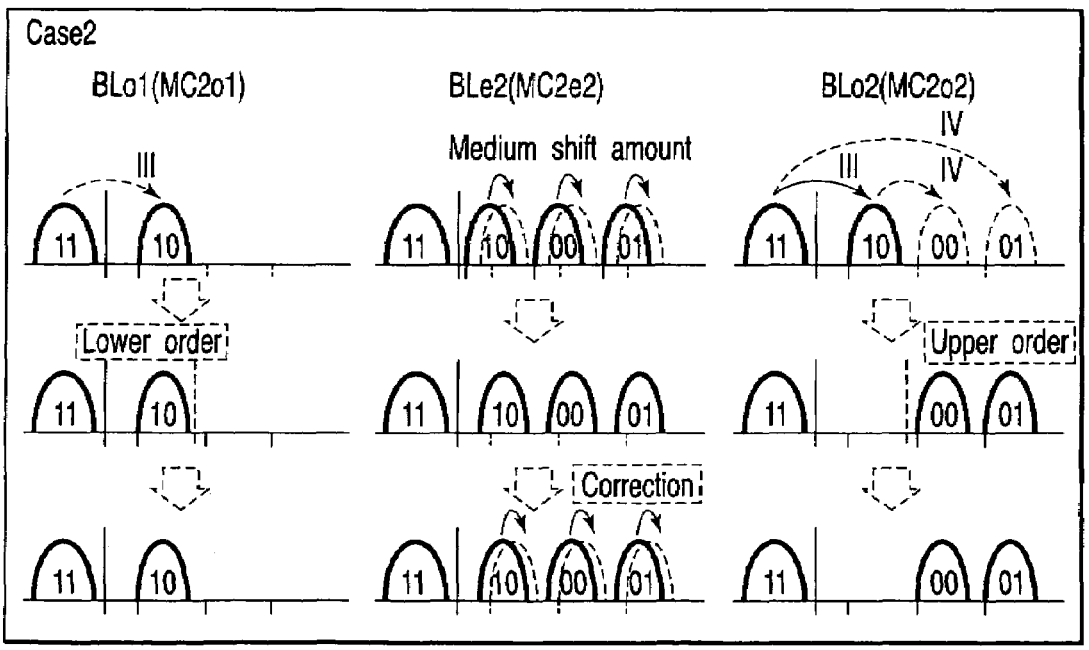
FIG. 26 is a view showing changes in threshold distributions according to the first example of the writing method of the third embodiment (Case 2)

As shown in FIG. 26, Case 2 is a case in which the level "10" is written in the memory cell MC2o1, and the level "00" or the level "01" is written in the memory cell MC2o2. That is, Case 2 is a case where upper-order writing and lower-order writing are carried out with respect to the memory cells MC2o1 and MC2o2.

In Case 2, a shift amount of a floating gate potential of the memory cell MC2e2 is rather small as compared with Case 1 where upper-order writing is performed with respect to both the memory cells MC2o1 and MC2o. In this specification, this will be referred to as a "medium shift amount".

Since Case 2 has the "medium shift amount", additional writing is carried out with respect to the memory cell MC2e2. Additional writing is executed in such a manner that the same threshold level as that in a case of the "large shift amount" described in conjunction with Case 1 can be obtained. A verify level at the time of additional writing is set higher for the proximity effect in Case 1 than a verify level at the time of regular writing. The degree of the proximity effect is dependent on a structure of each memory cell. An amount of additional writing may be appropriately determined in accordance with a structure of each memory cell.

<Case 3>

Figure 27:
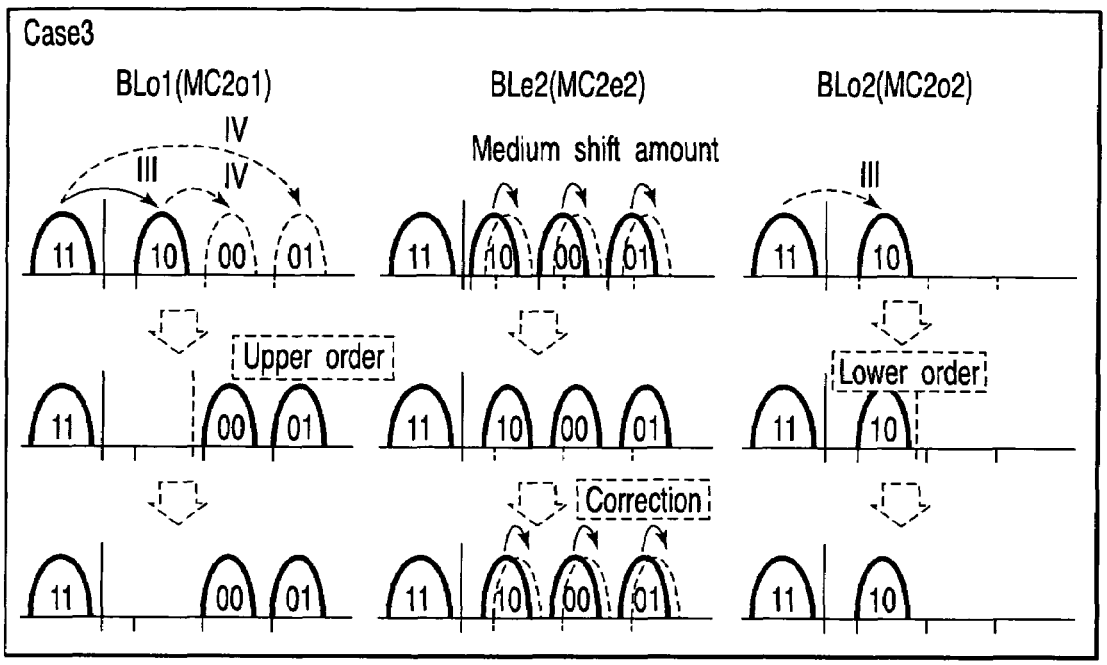
FIG. 27 is a view showing changes in threshold distributions according to the first example of the writing method of the third embodiment (Case 3)

As shown in FIG. 27, like Case 2, Case 3 is a case where upper-order writing is carried out with respect to one memory cell and lower-order writing is performed with respect to the other memory cell. Case 3 is different from Case 2 in that the level "01" is written in the memory cell MC2o1 and the level "00" is written in the memory cell MC2o2.

Since Case 3 has a "medium shift amount", additional writing is executed with respect to the memory cell MC2e2 like Case 2.

<Case 4>

Figure 28:
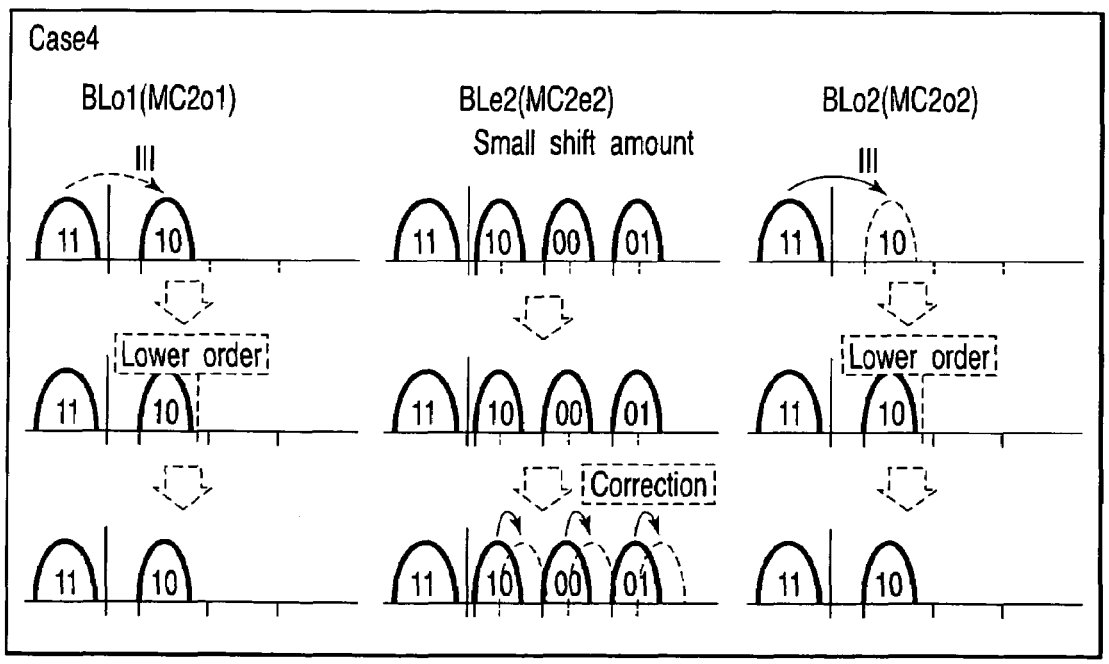
FIG. 28 is a view showing changes in threshold distributions according to the first example of the writing method of the third embodiment (Case 3)

As shown in FIG. 28, Case 4 is a case where the level "10" is written in both the memory cells MC2o1 and MC2o2.

In Case 4, lower-order writing is carried out with respect to both the memory cells MC2o1 and MC2o2. In Case 4, the influence of the proximity effect is minimum as compared with Case 1 to Case 3. That is, in the four cases, the influence of the proximity effect on the memory cell MC2e2 is minimum. In Case 4, a shift amount of a floating gate potential of the memory cell MC2e2 is very small, or this floating gate potential does not shift at all. This is referred to as a "small shift amount" in this specification.

Since Case 4 has the "small shift amount", additional writing is effected with respect to the memory cell MC2e2. Additional writing is carried out in such a manner that the same threshold level as that in a case of the "large shift amount" described in conjunction with Case 1 can be obtained.

SECOND EXAMPLE

This example is an example where the proximity effect occurs between memory cells which are adjacent to each other in a bit line direction. In this example, the proximity effect is corrected between memory cells which are adjacent to each other along the bit line direction, but the proximity effect is not corrected between memory cells which are adjacent along a word line direction.

Figure 29:
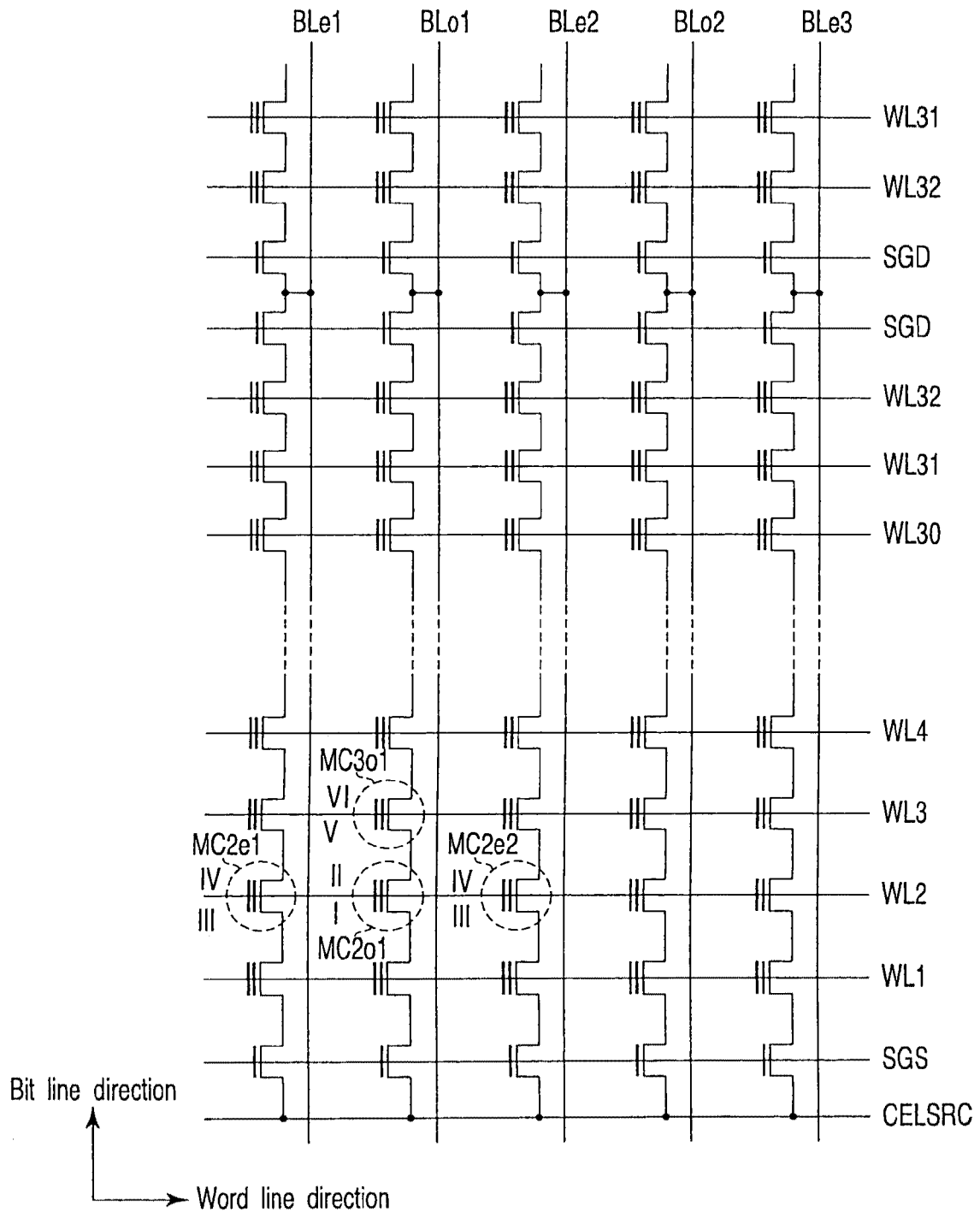
FIG. 29 is a view showing a second example of the writing method according to the third embodiment of the present invention.

As shown in FIG. 29, it is assumed that data is written in three memory cells MC2e1, MC2o1 and MC2e2 connected with a word line WL2 and one memory cell MC3o1 connected with a word line WL3. The memory cells MC2e1 and MC2e2 are respectively connected with the word line WL2 and an even-numbered bit line BLe1 and with the word line WL2 and an even-numbered bit line BLe2, and the memory cells MC2o1 and MC3o1 are respectively connected with the word line WL2 and an odd-numbered bit line BLo1 and with a word line WL3 and the odd-numbered bit line BLo1. In regard to a writing order, data is written in the memory cell MC2o1 (I, II), and then data is written in the memory cells MC2e1 and MC2e2 (III, IV). Thereafter, data is written in the memory cell MC3o1 (V, VI). In this case, as modes where the memory cell MC2o1 is affected by the proximity effect, there are two cases (Case 1 and Case 2).

<Case 1>

Figure 30:
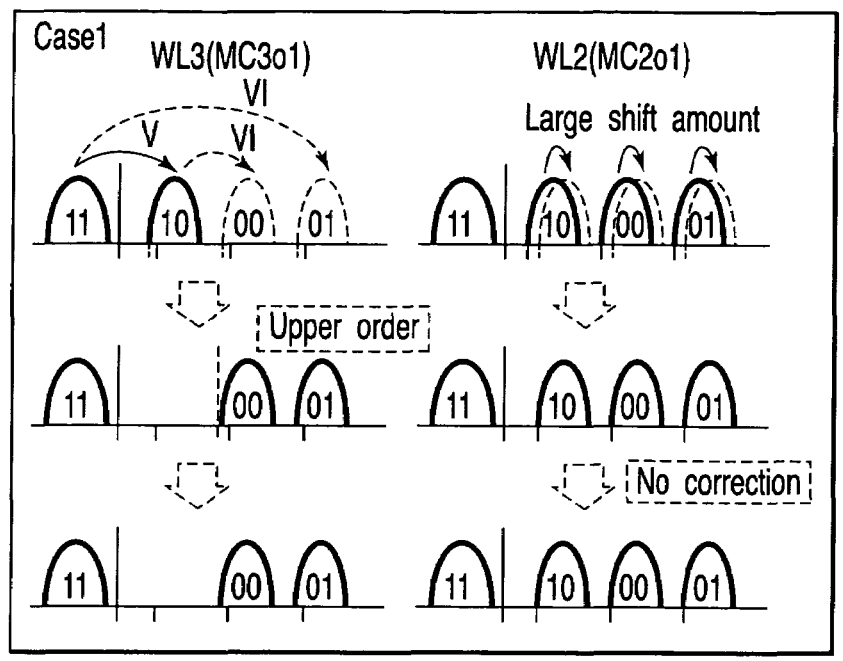
FIG. 30 is a view showing changes in threshold distributions according to the second example of the writing method of the third embodiment (Case 1)

As shown in FIG. 30, Case 1 is a case where a level "00" or a level "01 is written in the memory cell MC3o1.

In Case 1, since upper-order writing is executed with respect to the memory cell MC3o1, the memory cell MC2o1 is greatly affected by the proximity effect. In this second example, Case 1 has the greatest influence of the proximity effect. This is a so-called "large shift amount".

Since Case 1 has the "large shift amount", additional writing is not performed with respect to the memory cell MC2o1.

<Case 2>

Figure 31:
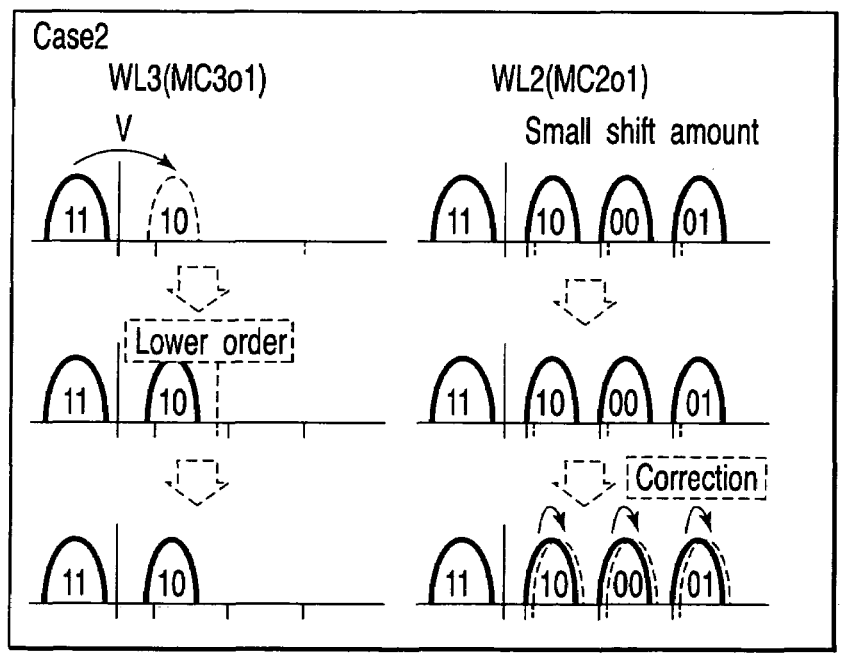
FIG. 31 is a view showing changes in threshold distributions according to the second example of the writing method of the third embodiment (Case 2)

As shown in FIG. 31, Case 2 is a case where a level "10" is written in the memory cell MC3o1.

In Case 2, since lower-order writing is carried out with respect to the memory cell MC3o1, the influence of the proximity effect on the memory cell MC2o1 is small. This is a so-called "small shift amount".

Since Case 2 has a "small shift amount", additional writing is executed with respect to the memory cell MC2o1. Additional writing is carried out in such a manner that the same threshold level as that in a case of the "large shift amount" described in conjunction with Case 1 can be obtained.

THIRD EXAMPLE

This example is an example where the proximity effect occurs both between memory cells which are adjacent to each other along a word line direction and between memory cells which are adjacent to each other along a bit line direction. In this example, the proximity effect is corrected both between memory cells which are adjacent to each other along the word line direction and between memory cells which are adjacent to each other along the bit line direction.

Figure 32:
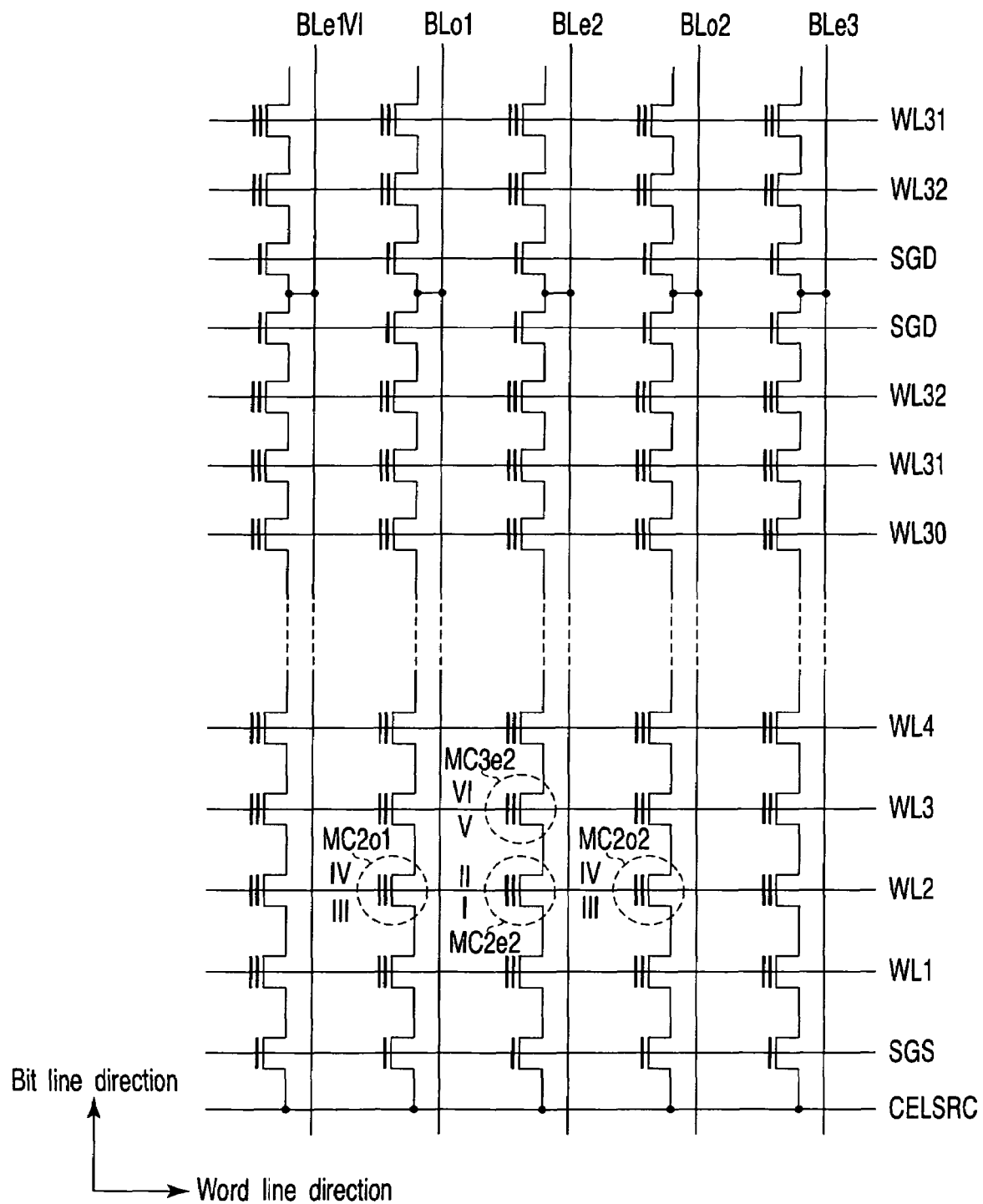
FIG. 32 is a view showing a third example of the writing method according to the third embodiment of the present invention.
Figure 33:
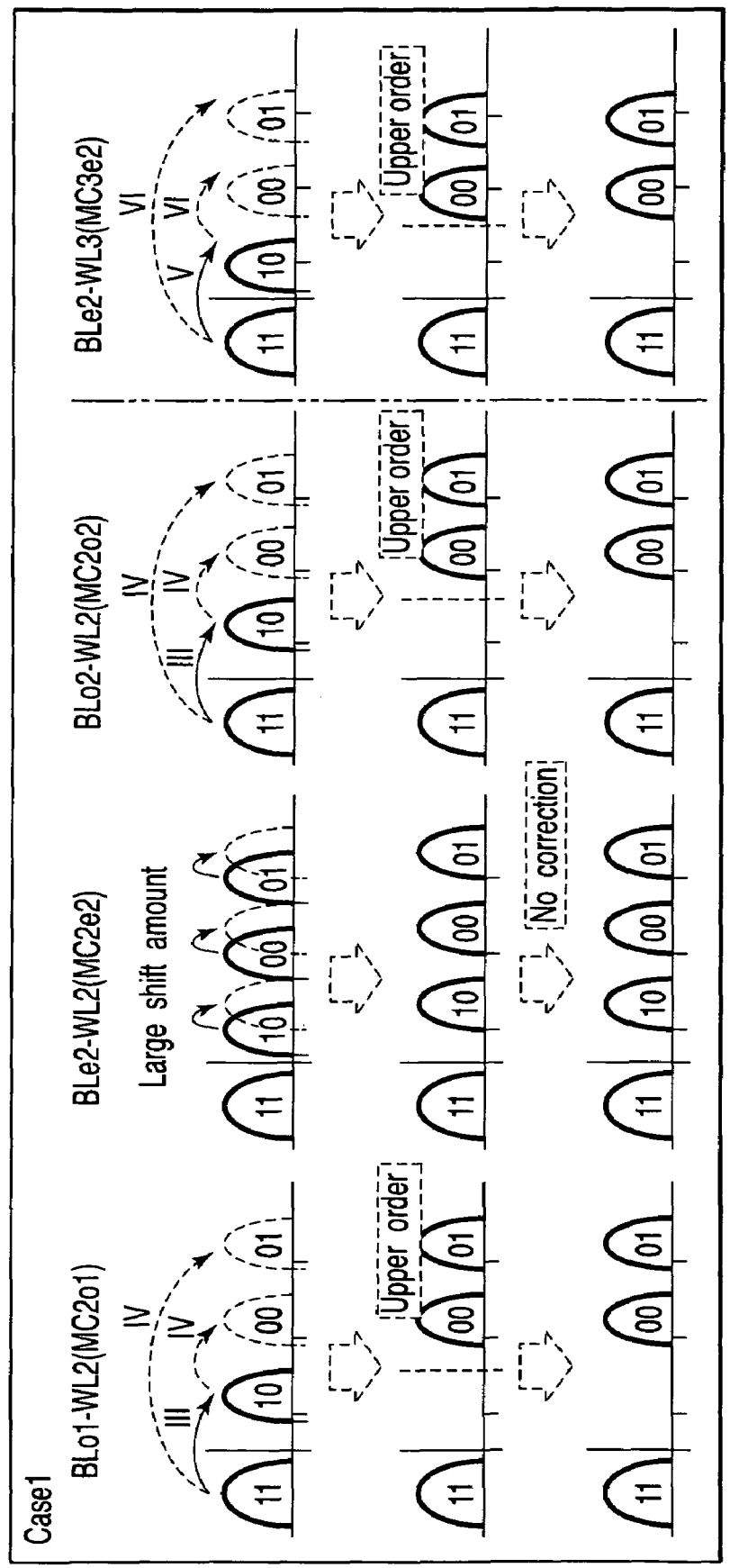
FIG. 33 is a view showing changes in threshold distributions according to the third example of the writing method of the third embodiment (Case 1)

As shown in FIG. 32, it is assumed that data is written in three memory cells MC2o1, MC2e2 and MC2o2 connected with a word line WL2 and one memory cell MC3e2 connected with a word line WL3. The memory cells MC2o1 and MC2o2 are respectively connected with the word line WL2 and an odd-numbered bit line BLo1 and with the word line WL2 and an odd-numbered bit line BLo2, and the memory cells MC2e2 and MC3e2 are respectively connected with the word line WL2 and an even-numbered bit line BLe2 and with the word line WL3 and the even-numbered bit line BLe2. In regard to a writing order, data is written in the memory cell MC2e2 (I, II), and then data is written in the memory cells MC2o1 and MC2o2 (III, IV). Thereafter, data is written in the memory cell MC3e2 (V, VI). In this case, as modes where the memory cell MC2e2 is affected by the proximity effect, there are eight cases (Case 1 to Case 8).

<Case 1>

As shown in FIG. 30, Case 1 is a case where a level "00" or a level "01" is written in the memory cells MC2o1, MC2o2 and MC3e2.

In Case 1, since upper-order writing is carried out with respect to all of the memory cells MC2o1, MC2o2 and MC3e2, the memory cell MC2e2 is greatly affected by the proximity effect. In this third example, Case 1 has the largest influence on the proximity effect. This is a "large shift amount".

Since Case 1 has the "large shift amount", additional writing is not carried out with respect to the memory cell MC2e2.

<Case 2>

Figure 34:
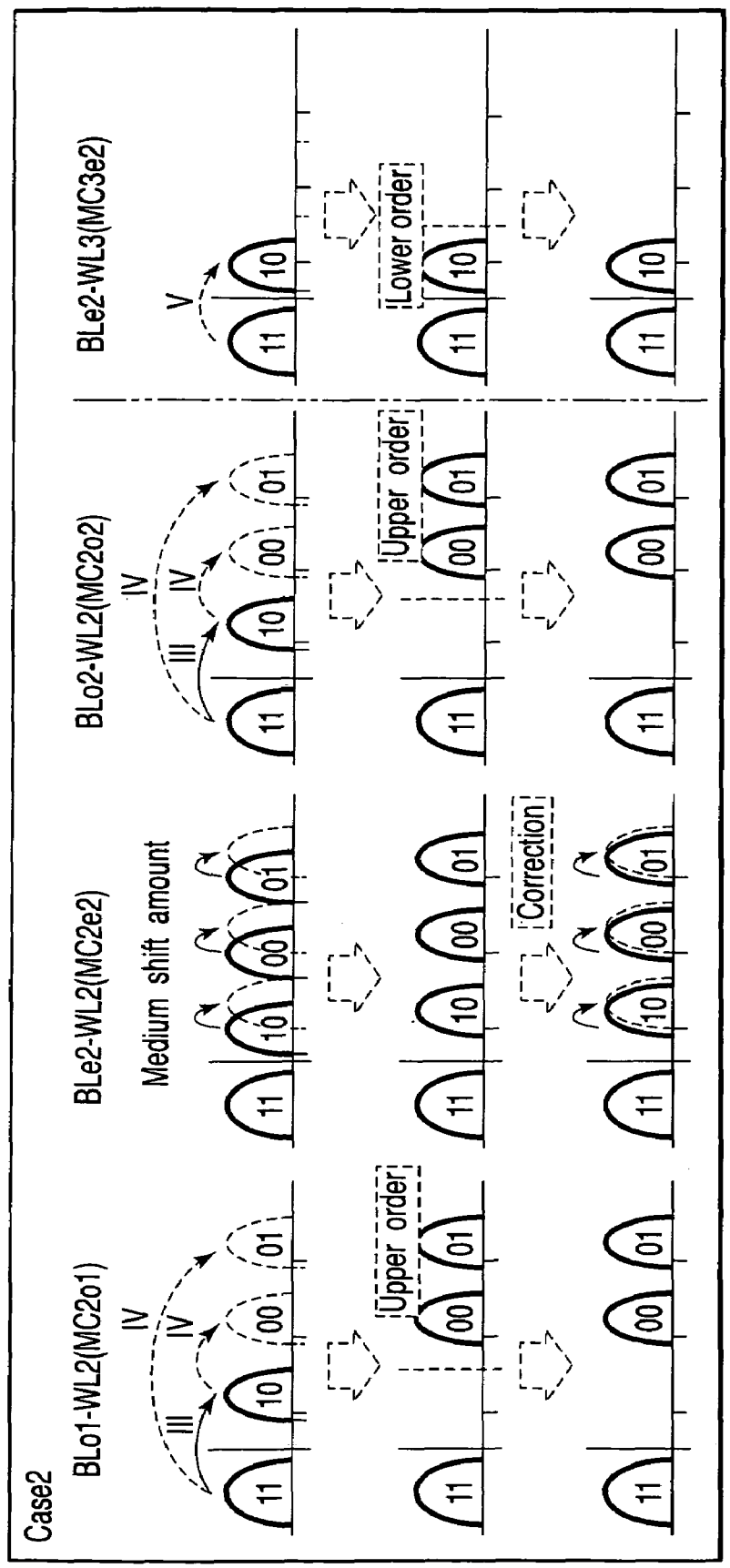
FIG. 34 is a view showing changes in threshold distributions according to the third example of the writing method of the third embodiment (Case 2)

As shown in FIG. 34, Case 2 is a case where a level "00" or a level "01" is written in the memory cells MC2o1 and MC2o2 and a level "10" is written in the memory cell MC3e2.

In Case 2, upper-order writing is performed with respect to the memory cells MC2o1 and MC2o2, and lower-order writing is carried out with respect to the memory cell MC3e2. A shift amount in Case 2 is slightly smaller than that in Case 1. It is a "medium shift amount".

Since Case 2 has the "medium shift amount", additional writing is performed with respect to the memory cell MC2e2. Additional writing is executed in such a manner that the same threshold value level as that in the case of a "large shift amount" described in conjunction with Case 1 can be obtained.

<Case 3>

Figure 35:
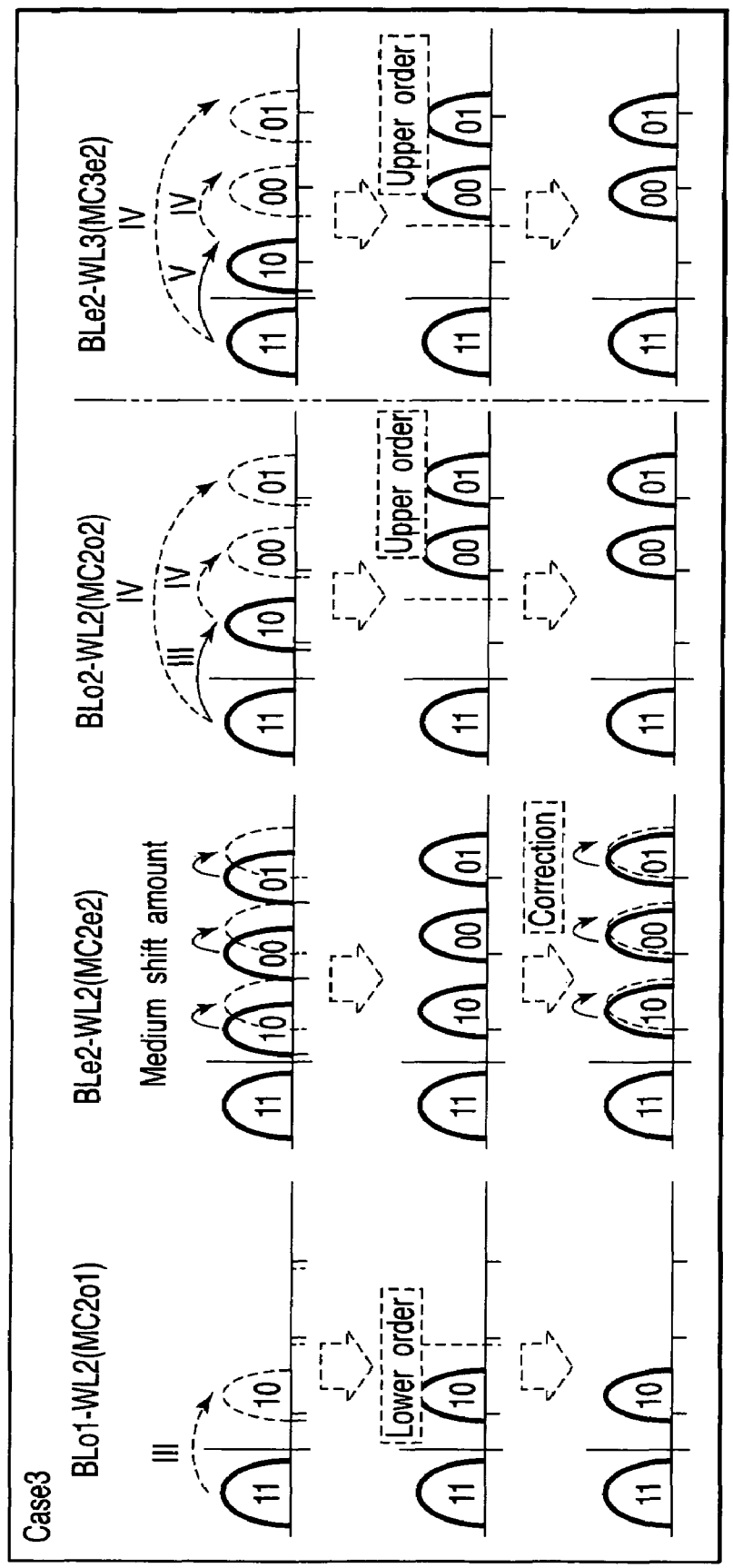
FIG. 35 is a view showing changes in threshold distributions according to the third example of the writing method of the third embodiment (Case 3)

As shown in FIG. 35, Case 3 is a case where a level "10" is written in the memory cell MC2o1 and a level "00" or a level "01" is written in the memory cells MC2o2 and MC3e2.

In Case 3, lower-order writing is performed with respect to the memory cell MC2o1, and upper-order writing is carried out with respect to the memory cells MC2o2 and MC3e2. A shift amount of Case 3 is slightly smaller than that in Case 1. It is a "medium shift amount".

Since Case 3 has the "medium shift amount", additional writing is carried out with respect to the memory cell MC2e2.

<Case 4>

As shown in FIG. 36, Case 4 is different from Case 3 in that a level "10" is written in the memory cell MC3e2. Case 4 is the same as Case 3 except this point.

Since lower-order writing is performed with respect to the memory cell MC3e2 in Case 4, a shift amount of Case 4 is slightly smaller than that in Case 3. However, it can be considered that Case 4 has a "medium shift amount".

Since Case 4 has the "medium shift amount", additional writing is performed with respect to the memory cell MC2e2.

<Case 5>

Figure 37:
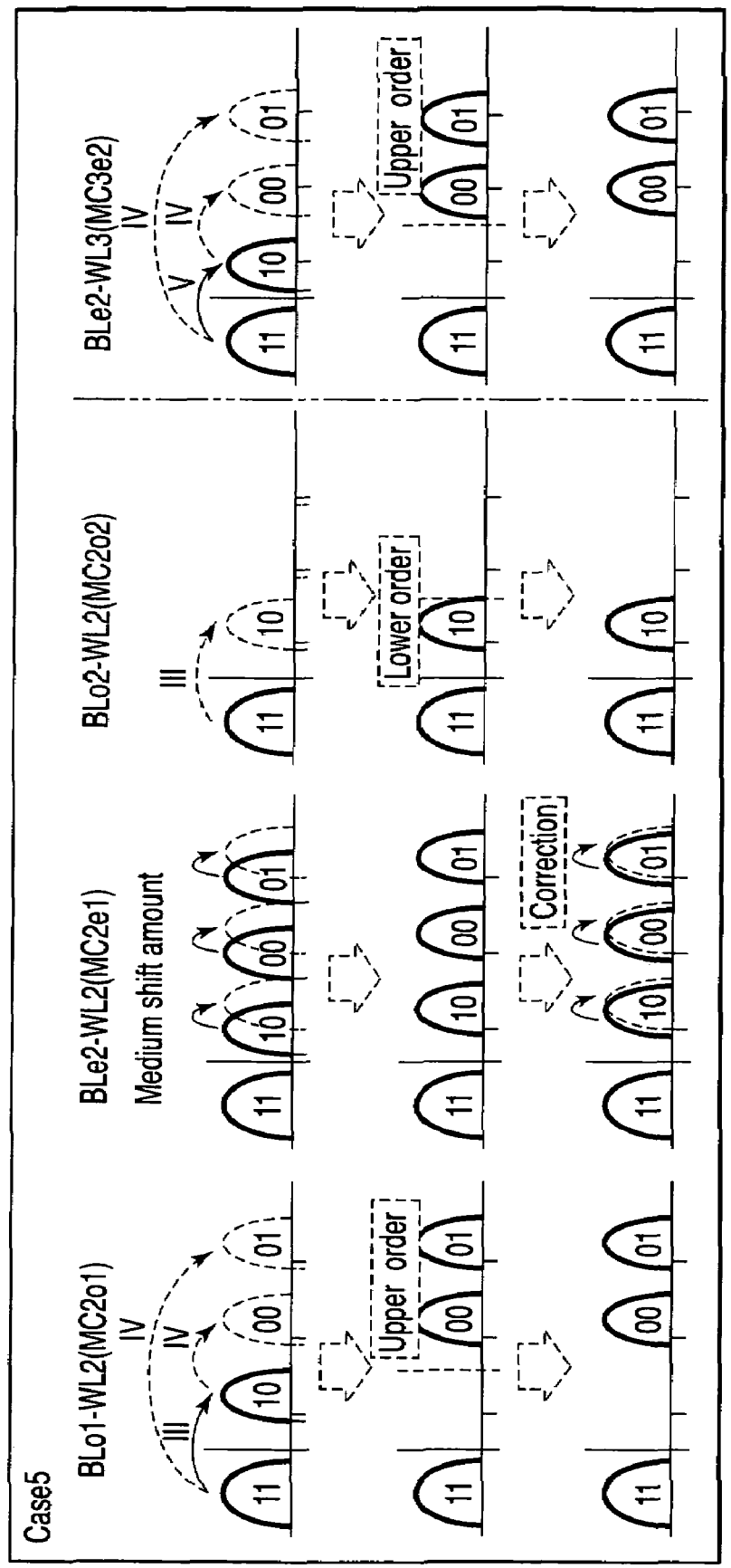
FIG. 37 is a view showing changes in threshold distributions according to the third example of the writing method of the third embodiment (Case 5)

As shown in FIG. 37, Case 5 is different from Case 3 in that a level "00" or "01" is written in the memory cell MC2o1 and a level "10" is written in the memory cell MC2o2. Case 5 has a "medium shift amount" like Case 3.

Since Case 5 has the "medium shift amount", additional writing is performed with respect to the memory cell MC2e2.

<Case 6>

Figure 38:
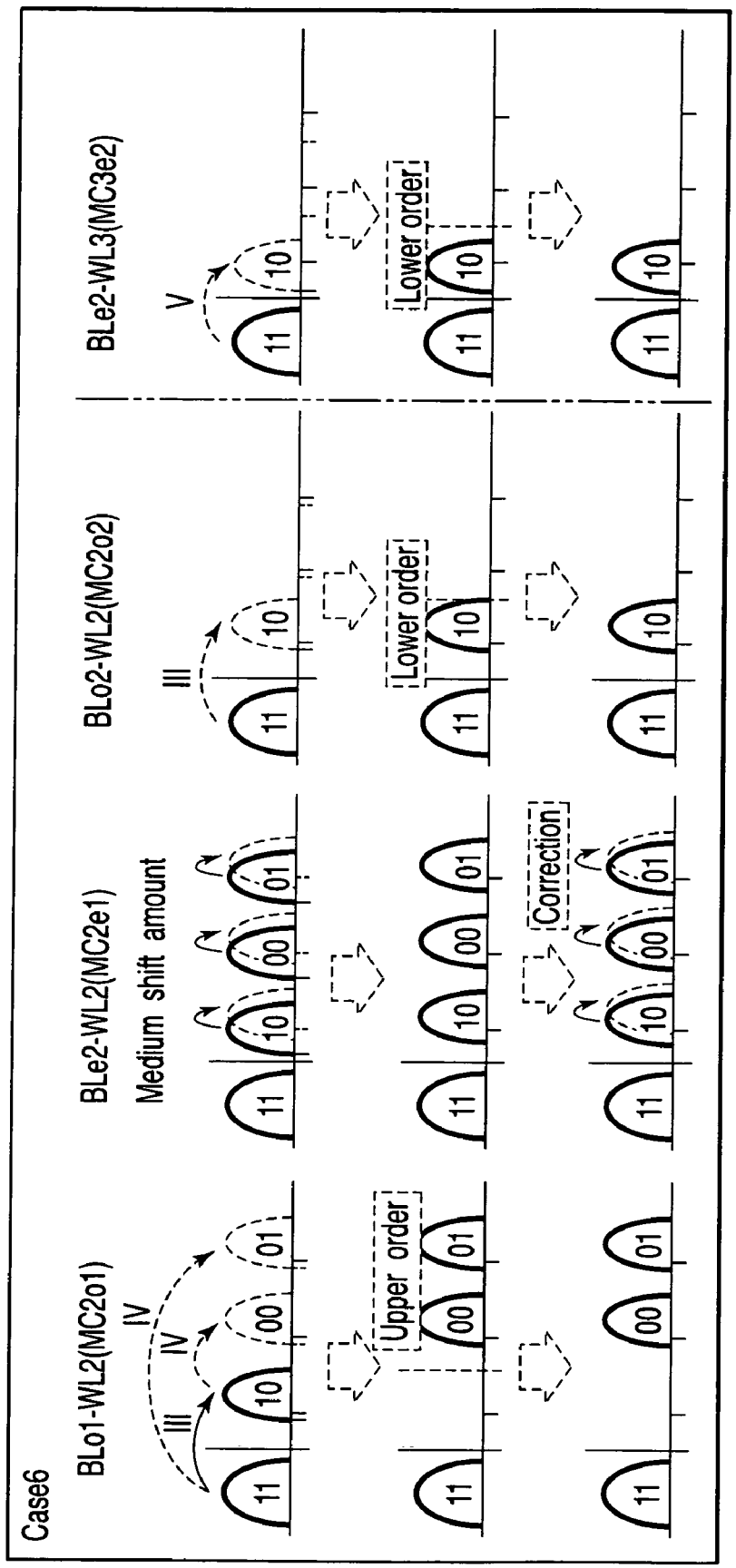
FIG. 38 is a view showing changes in threshold distributions according to the third example of the writing method of the third embodiment (Case 6)

As shown in FIG. 38, Case 6 is different from Case 4 in that a level "00" or "01" is written in the memory MC2o1 and a level "10" is written in the memory cell MC2o2. Case 6 has a "medium shift amount" like Case 4.

Since Case 6 has the "medium shift amount", additional writing is carried out with respect to the memory cell MC2e2.

<Case 7>

Figure 39:
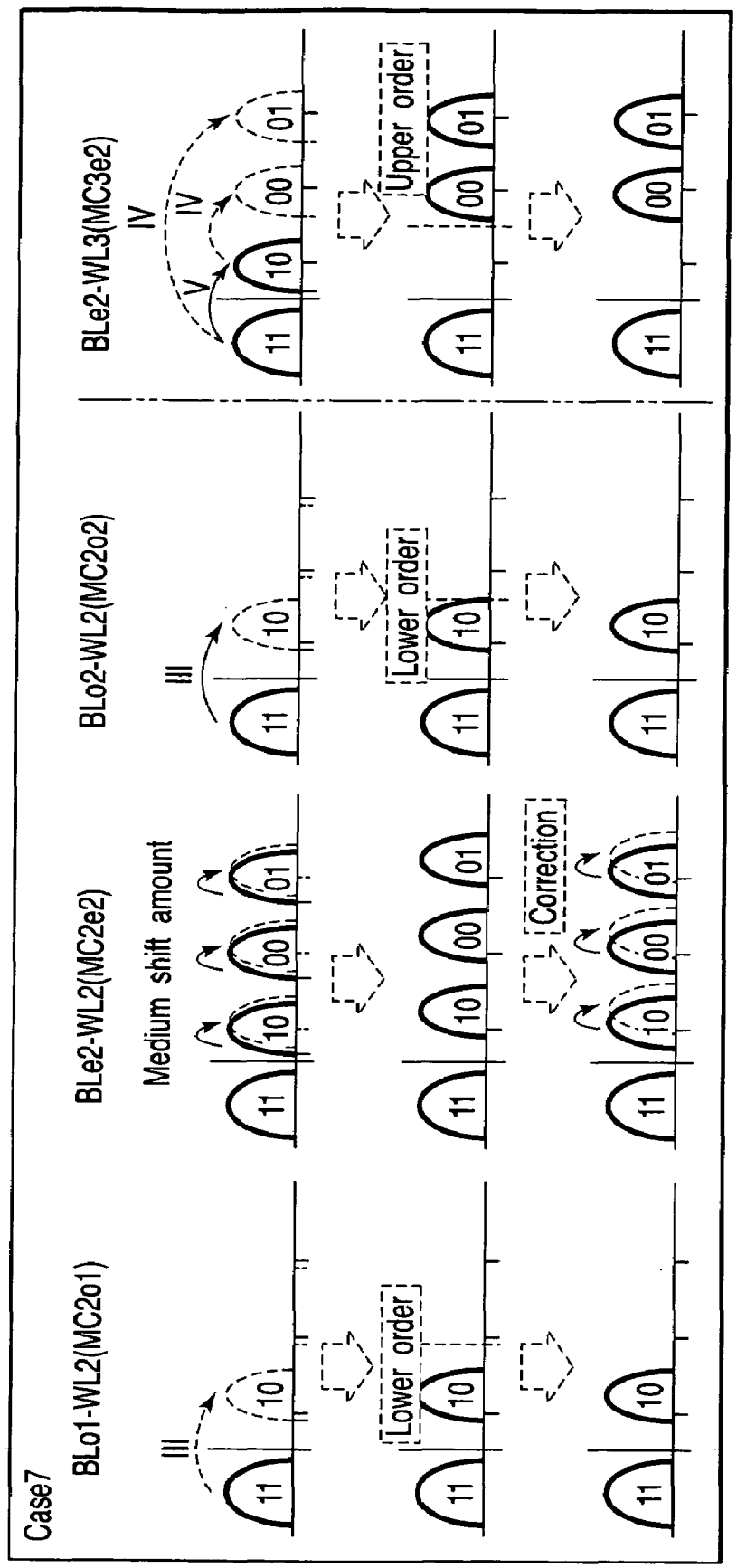
FIG. 39 is a view showing changes in threshold distributions according to the third example of the writing method of the third embodiment (Case 7)

As shown in FIG. 39, Case 7 is a case where a level "10" is written in the memory cells MC2o1 and MC2o2 and a level "00" or "01" is written in the memory cell MC3o2.

In Case 7, lower-order writing is carried out with respect to the memory cells MC2o1 and MC2o2 and upper-order writing is performed with respect to the memory cell MC3e2. Since lower-order writing is executed with respect to both the memory cells MC2o1 and MC2o2, Case 7 has a shift amount slightly smaller than that in Case 5. However, it can be considered that Case 7 has a "medium shift amount".

Since Case 7 has the "medium shift amount", additional writing is performed with respect to the memory cell MC2e2.

<Case 8>

Figure 40:
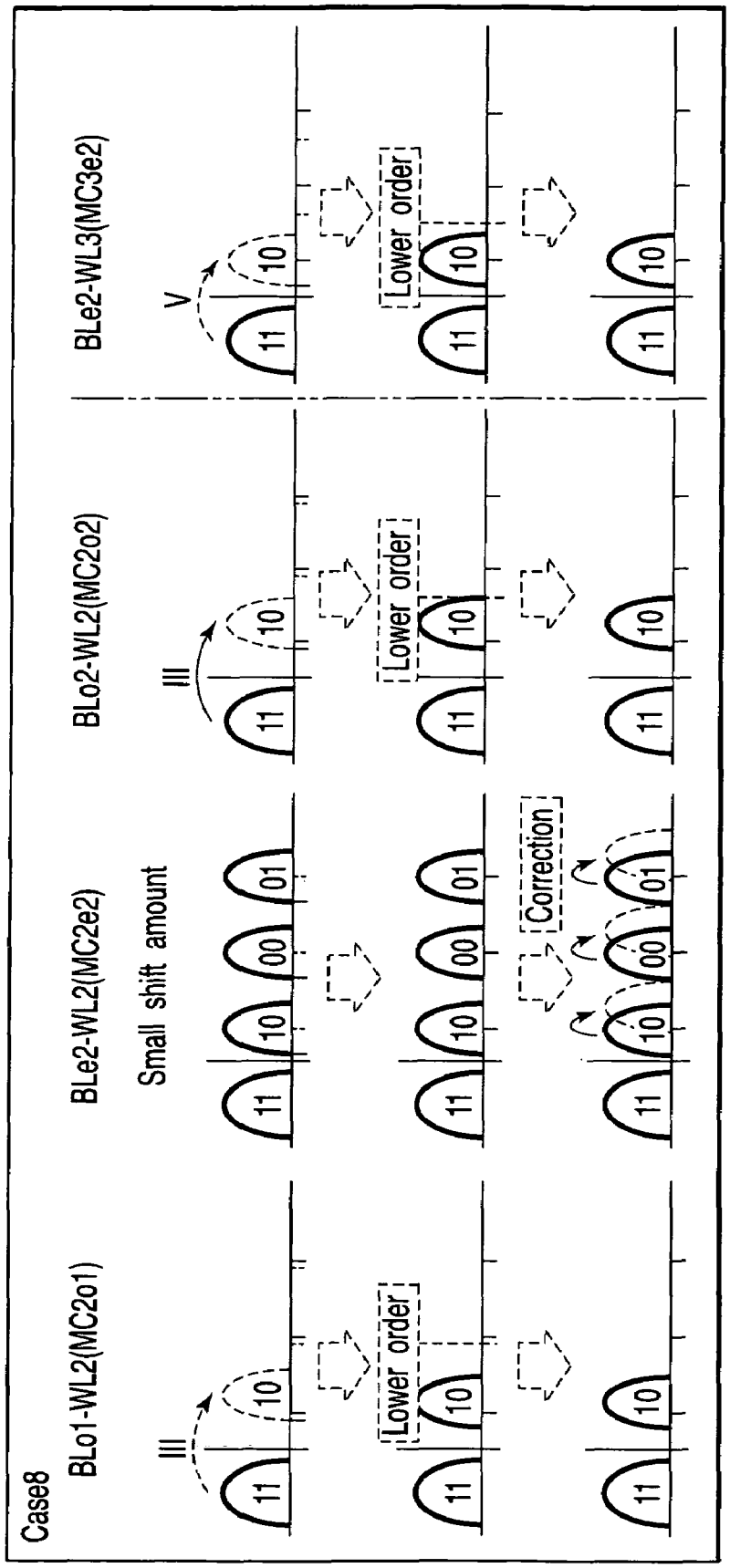
FIG. 40 is a view showing changes in threshold distributions according to the third example of the writing method of the third embodiment (Case 8)

As shown in FIG. 40, Case 8 is different from Case 7 in that a level "10" is written in the memory cell MC3e2.

Since lower-order writing is carried out with respect to all of the memory cells MC2o1, MC2o2 and MC3e2 in Case 8, the influence of the proximity effect on the memory cell MC2e2 is small. In this third example, the influence of the proximity effect in Case 8 is minimum. It is a "small shift amount".

Since Case 8 has the "small shift amount", additional writing is carried out with respect to the memory cell MC2e2.

According to the third embodiment, since a threshold value is corrected in accordance with each case where the threshold value shifts at the maximum level, a narrow threshold distribution width can be obtained even if the proximity effect occurs.

Fourth Embodiment

This is an example concerning verify reading for additional writing.

In the case of performing additional writing, data stored in an adjoining cell on a downstream side must be read. In a regular read operation, since enabling a judgment upon data stored in a specified page can suffice, the read operation is executed twice or once depending on reading an even-numbered page or an odd-numbered page. However, which one of four threshold levels has the data is not judged. Therefore, a necessary verify order differs depending on a specified address, and hence pre-charge of a bit line, discharge using a cell current and recovery of a bit line potential must be carried out as one set of operations.

In reading at the time of additional writing according to this example, a threshold order stored in a cell must be judged. Therefore, an even-numbered page and an odd-numbered page recorded in the same cell must be continuously read.

This can suppress a time and a current required for pre-charge of a bit line and recovery of a bit line by reading threshold levels of cells in ascending order. A concrete operation method will now be described hereinafter.

Figure 41:
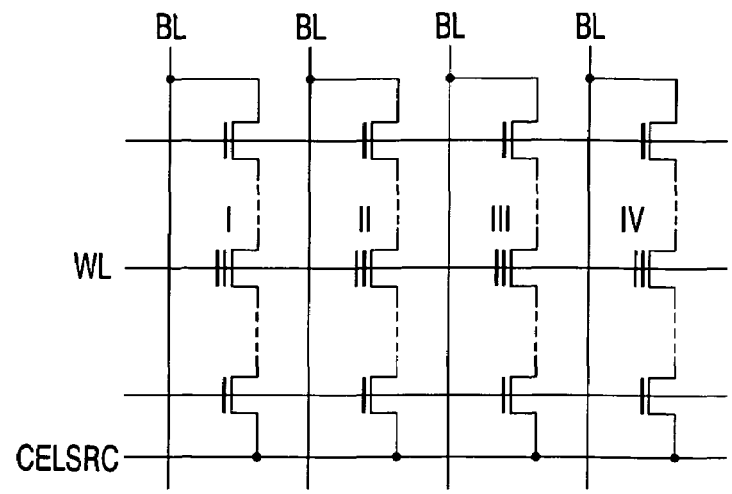
FIG. 41 is a view showing a part of a memory cell array in which NAND type unit cells are arranged.

FIG. 41 is a view showing a part of a memory cell array in which NAND type unit cells are arranged.

Figure 42:
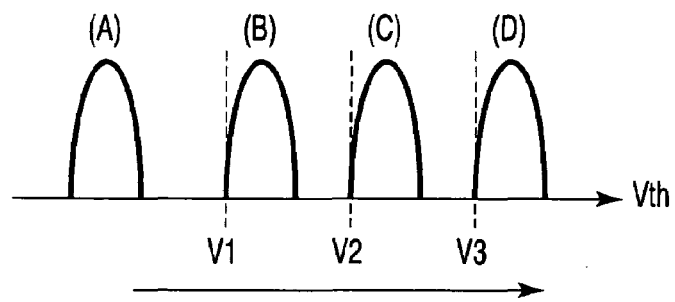
FIG. 42 is a view showing threshold distributions.
Figure 43:
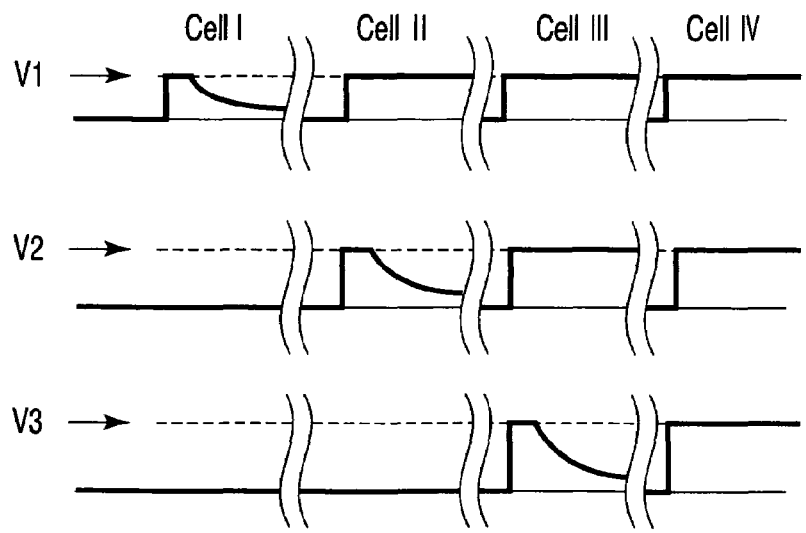
FIG. 43 is a view showing an image of changes in currents flowing through cells.

In FIG. 41, threshold voltages Vth of cells I, II, III and IV are set to A, B, C and D as depicted in FIG. 42. In regard to reading data from the cells I to IV, data is read from the lowest threshold level. As to this procedure, pre-charge of a bit line, reading of Vth1, reading of Vth2, reading of Vth3 and a recovery operation are considered in the mentioned order. At this time, bit line electric charges which have remained without being discharged by a cell current are reutilized as pre-charge electric charges for the next reading. Further, in a cell through which the cell current has once flowed and whose Vth order is determined, its bit line is not pre-charged. FIG. 43 shows an image of changes in current flowing through each cell caused by the above-described series of operations.

The pre-charge electric charges and a discharge current at the time of the read operation serve as noise which adversely affects each operation. In a prior art, a source line potential is usually increased due to the discharge current at the time of reading, and a given time is required for this increase to be eliminated. Therefore, in order to avoid the influence of noise due to this problem, the next operation is stopped until the generated potential is completely eliminated. Therefore, a time lag occurs in the continuous operation in the present circumstances.

In the read operation at the time of additional writing according to this example, since pre-charge for a cell whose threshold voltage Vth has been determined is not necessary, an adverse effect of noise due to pre-charge electric charges can be reduced by an amount corresponding to this cell as compared with the prior art.

At the same time, since the discharge current is also reduced, a change in source potential due to this current can be suppressed as compared with the conventional read mode, and a time required for the generated potential to be eliminated can be shortened, thereby realizing a high-speed operation.

Although the above has described the present invention based on the several embodiments, the present invention is not restricted to the foregoing embodiments, and various modifications can be carried out without departing from the scope of the invention when embodying the present invention.

Furthermore, each of the embodiments can be solely carried out, but these embodiments can be appropriately combined and carried out.

Moreover, each embodiment includes inventions on various stages, and the inventions on various stages can be extracted by appropriately combining a plurality of structural requirements disclosed in each of the embodiments.

Additionally, although the embodiments have been described based on the examples in which the present invention is applied to the NAND type flash memory, the present invention is not restricted to the NAND type flash memory, and it can be applied to flash memories other than the NAND type, e.g., an AND type or an NOR type. Further, semiconductor integrated circuit devices each including such a flash memory, e.g., a processor or a system LSI are included in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit device comprising:
   a memory cell array having a plurality of blocks each including a plurality of pages;
   a first non-volatile semiconductor memory cell which has an electric charge storage layer and is arranged in the memory cell array;
   a second non-volatile semiconductor memory cell which has an electric charge storage layer and is arranged in the memory cell array to be adjacent to the first non-volatile semiconductor memory cell;
   a third non-volatile semiconductor memory cell which has an electric charge storage layer and is arranged in the memory cell array to be adjacent to the first non-volatile semiconductor memory cell;
   a fourth non-volatile semiconductor memory cell which has an electric charge storage layer and is arranged in the memory cell array to be adjacent to the second non-volatile semiconductor memory cell;
   a first bit line extending along a bit line direction;
   a second bit line extending along the bit line direction;
   a first word line extending along a word line direction crossing the bit line direction, the electric charge storage layer of the first non-volatile semiconductor memory cell being capacity-coupled with the first word line, one end of a current path of the first non-volatile semiconductor memory cell being connected with one end of a current path of the third non-volatile semiconductor memory cell, the electric charge storage layer of the second non-volatile semiconductor memory cell being capacity-coupled with the first word line, one end of a current path of the second non-volatile semiconductor memory cell being connected with one end of a current path of the fourth non-volatile semiconductor memory cell; and
   a second word line extending along the word line direction, the electric charge storage layer of the third non-volatile semiconductor memory cell being capacity-coupled with the second word line, the other end of the current path of the third non-volatile semiconductor memory cell being electrically connected with the first bit line, the electric charge storage layer of the fourth non-volatile semiconductor memory cell being capacity-coupled with the second word line, the other end of the current path of the fourth non-volatile semiconductor memory cell being electrically connected with the second bit line,
   wherein regular data writing is performed with respect to the second non-volatile semiconductor memory cell after regular data writing is carried out with respect to the first non-volatile semiconductor memory cell,
   regular data writing is performed with respect to the third non-volatile semiconductor memory cell after regular data writing is carried out with respect to the second non-volatile semiconductor memory cell, and
   additional data writing is performed with respect to the first non-volatile semiconductor memory cell after regular data writing is carried out with respect to the third non-volatile semiconductor memory cell.

2. The device according to claim 1, wherein a verify voltage used for regular data writing with respect to the first non-volatile semiconductor memory cell is different from a verify voltage used for additional data writing with respect to the first non-volatile semiconductor memory cell.

3. The device according to claim 1, wherein the additional data writing is carried out after writing in one block in the plurality of blocks is finished or after writing in one page in the plurality of pages is finished.

4. The device according to claim 1, wherein, as the additional writing, there are a case where a threshold value of the first non-volatile semiconductor memory cell is shifted in accordance with data written in the second non-volatile semiconductor memory cell and a case where a shift of the threshold value is suppressed.

5. The device according to claim 1, wherein, when data stored in the first non-volatile semiconductor memory cell has three or more levels,
   verify reading at the time of the additional writing sequentially supplies two or more verify voltages corresponding to levels of the data having three or more levels to a word line connected with a gate of the first non-volatile semiconductor memory cell in a state where a bit line electrically connected with one end of the current path of the first non-volatile semiconductor memory cell is pre-charged.

6. The device according to claim 1, wherein the first non-volatile semiconductor memory cell and the third non-volatile semiconductor memory cell constitute a first NAND type unit cell, and the second non-volatile semiconductor memory cell and the fourth non volatile semiconductor memory cell constitute a second NAND type unit cell.

7. A semiconductor integrated circuit device comprising:
   a memory cell array having a plurality of blocks each including a plurality of pages;

a storage circuit configured to store a correction amount;

a calculation circuit configured to calculate the correction amount;

a first non-volatile semiconductor memory cell which is arranged in the memory cell array and has an electric charge storage layer; and a second non-volatile semiconductor memory cell which is arranged in the memory cell array to be adjacent to the first non-volatile semiconductor memory cell, wherein regular data writing is performed with respect to the second non-volatile semiconductor memory cell after regular data writing is carried out with respect to the first non-volatile semiconductor memory cell, additional data writing is performed with respect to the first non-volatile semiconductor memory cell after regular data writing is carried out with respect to the second non-volatile semiconductor memory cell, the calculation circuit calculates an amount of the additional data writing based on the regular data written to the first and second non-volatile semiconductor memory cells, the storage circuit stores a calculation result from the calculation circuit, the additional data writing is performed after writing one of the plurality of pages, or after writing one of the plurality of blocks, and the calculation of the amount of the additional data writing is performed in parallel with the regular data writing.

8. The device according to claim 7, wherein the additional data writing varies an amount of shift of a threshold value of the first non-volatile semiconductor memory cell in accordance with data written to the first non-volatile semiconductor memory cell and data written to the second non-volatile semiconductor memory cell.

9. The device according to claim 8, wherein the amount of shift of the threshold value of the first non-volatile semiconductor memory cell by a proximity effect is discriminated with levels of high, middle and low, the amount of shift is made the largest when the amount of shift of the threshold value is small and, is made smaller when the amount of shift of the threshold value is larger.

* * * * *